(12) United States Patent
Matsuoka et al.

(10) Patent No.: US 11,538,794 B2
(45) Date of Patent: Dec. 27, 2022

(54) POWER CONVERTER WITH AN UPPER ARM AND A LOWER ARM AND AT LEAST FIRST AND SECOND SEMICONDUCTOR DEVICES CONNECTED BY A BRIDGING MEMBER

(71) Applicant: DENSO CORPORATION, Kariya (JP)

(72) Inventors: Tetsuya Matsuoka, Kariya (JP); Yuu Yamahira, Kariya (JP); Kazuma Fukushima, Kariya (JP); Noriyuki Kakimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 199 days.

(21) Appl. No.: 16/904,088

(22) Filed: Jun. 17, 2020

(65) Prior Publication Data

US 2020/0321319 A1 Oct. 8, 2020

Related U.S. Application Data

(63) Continuation of application No. PCT/JP2018/039116, filed on Oct. 22, 2018.

(30) Foreign Application Priority Data

Dec. 19, 2017 (JP) .............................. JP2017-242698

(51) Int. Cl.
*H01L 25/07* (2006.01)
*H01L 25/18* (2006.01)
(Continued)

(52) U.S. Cl.
CPC .............. *H01L 25/07* (2013.01); *H01L 25/18* (2013.01); *H01L 29/7393* (2013.01); *H02M 7/48* (2013.01)

(58) Field of Classification Search
CPC ....... H01L 25/03; H01L 25/04; H01L 25/041; H01L 25/042; H01L 25/043;
(Continued)

(56) References Cited

U.S. PATENT DOCUMENTS

2014/0153189 A1* 6/2014 Okamura ............. H05K 7/1432
361/688
2016/0247793 A1 8/2016 Ohno
(Continued)

FOREIGN PATENT DOCUMENTS

WO 2019/021731 A1 1/2019

*Primary Examiner* — Thienvu V Tran
*Assistant Examiner* — Carlos O Rivera-Perez
(74) *Attorney, Agent, or Firm* — Oliff PLC

(57) ABSTRACT

A power converter includes: at least one pair of first and second semiconductor devices including multiple first and second semiconductor chips, having first and second switching elements providing upper and lower arms, and multiple first and second main terminals having at least one of multiple first and second high potential terminals and multiple first and second low potential terminals; and a bridging member providing an upper and lower coupling portion, together with the first low and second high potential terminals. The first and second semiconductor chips are arranged in line symmetry with respect to first and second axes and in line symmetry with the second axis as a symmetry axis to differentiate the arrangement of the second low potential terminal with respect to the second high potential terminal from the arrangement of the first low potential terminal with respect to the first high potential terminal.

16 Claims, 21 Drawing Sheets

(51) Int. Cl.
*H01L 29/739* (2006.01)
*H02M 7/48* (2007.01)

(58) Field of Classification Search
CPC ............. H01L 25/0652; H01L 25/0655; H01L 25/0657; H01L 25/07; H01L 25/071; H01L 25/072; H01L 25/074; H01L 25/075; H01L 25/0753; H01L 25/0756; H01L 25/18; H01L 29/739; H01L 29/7393; H01L 29/7394; H01L 29/7395; H01L 23/31; H01L 23/3107; H01L 23/3114; H01L 23/3121; H01L 23/36; H01L 23/367; H01L 23/4012; H01L 23/4018; H01L 23/4031; H01L 23/49541; H01L 23/4952; H01L 23/49513; H01L 23/50; H01L 2224/32221; H01L 2224/32245; H01L 2224/3318; H01L 2224/33181; H01L 2924/15; H01L 2924/181; H01L 2924/1811; H01L 2924/1815; H01L 2924/18165; H02M 7/00; H02M 7/003; H02M 7/42; H02M 7/44; H02M 7/48; H02M 7/493; H02M 7/515; H02M 7/521; H02M 7/5387; H02M 1/088

USPC ..... 323/271–275, 282–285, 351; 363/15–17, 363/40–43, 65, 71, 72, 95–99, 131–134, 363/141, 144, 146, 147; 257/666, 257/672–678, 685, 686, 690–693, 712, 257/714, 773, 777

See application file for complete search history.

(56) References Cited

U.S. PATENT DOCUMENTS

2016/0254206 A1    9/2016   Ohno
2018/0130748 A1*   5/2018   Ueta ..................... H01L 24/30

\* cited by examiner

FIG. 27
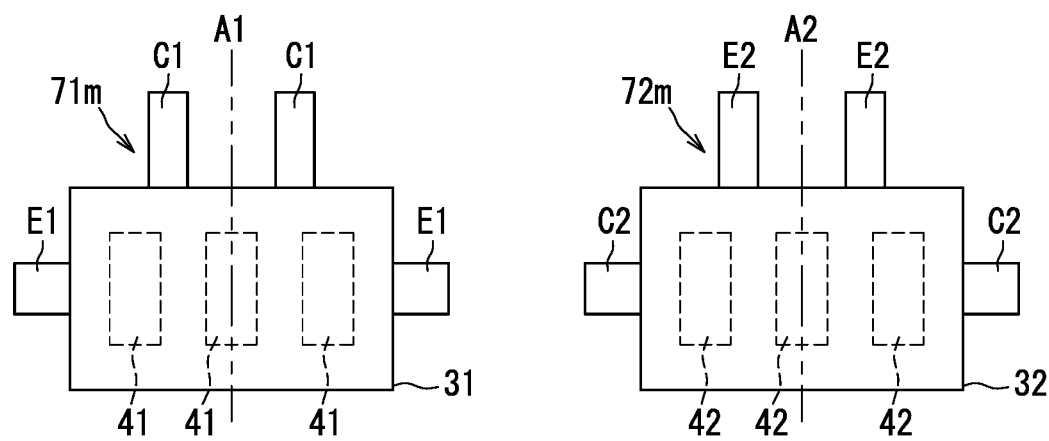
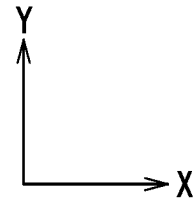
FIG. 28
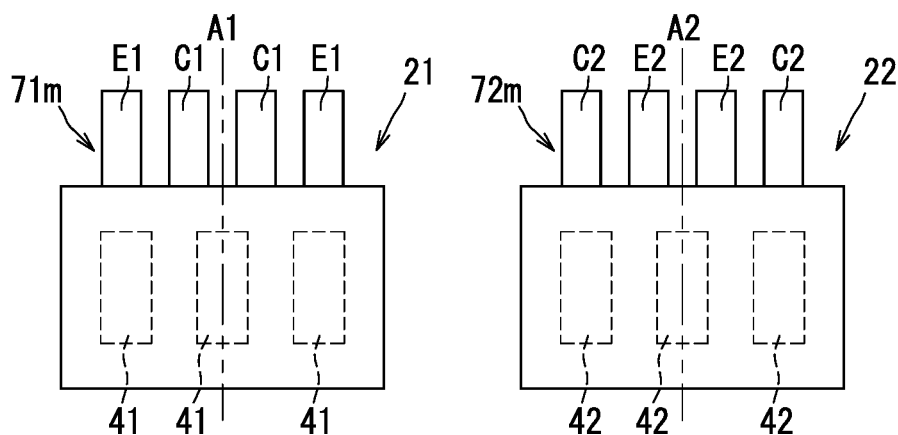
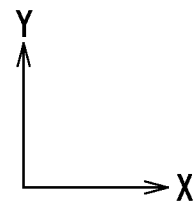

US 11,538,794 B2

POWER CONVERTER WITH AN UPPER ARM AND A LOWER ARM AND AT LEAST FIRST AND SECOND SEMICONDUCTOR DEVICES CONNECTED BY A BRIDGING MEMBER

CROSS REFERENCE TO RELATED APPLICATION

The present application is a continuation application of International Patent Application No. PCT/JP2018/039116 filed on Oct. 22, 2018, which designated the U.S. and claims the benefit of priority from Japanese Patent Application No. 2017-242698 filed on Dec. 19, 2017. The entire disclosures of all of the above applications are incorporated herein by reference.

TECHNICAL FIELD

The present disclosure relates to a power converter.

BACKGROUND

A conceivable power converter includes two types of semiconductor devices configuring upper and lower arms. One of the semiconductor devices has two semiconductor chips on which an IGBT is formed, and the IGBTs are connected in parallel with each other to configure an upper arm. The remaining one of the semiconductor devices has two semiconductor chips on which an IGBT is formed, and the IGBTs is connected in parallel with each other to configure a lower arm.

SUMMARY

According to an example embodiment, a power converter includes: at least one pair of first and second semiconductor devices including multiple first and second semiconductor chips, having first and second switching elements providing upper and lower arms, and multiple first and second main terminals having at least one of multiple first and second high potential terminals and multiple first and second low potential terminals; and a bridging member providing an upper and lower coupling portion, together with the first low and second high potential terminals. The first and second semiconductor chips are arranged in line symmetry with respect to first and second axes and in line symmetry with the second axis as a symmetry axis to differentiate the arrangement of the second low potential terminal with respect to the second high potential terminal from the arrangement of the first low potential terminal with respect to the first high potential terminal.

BRIEF DESCRIPTION OF THE DRAWINGS

The above and other objects, features and advantages of the present disclosure will become more apparent from the following detailed description made with reference to the accompanying drawings. In the drawings:

FIG. 27 is a plan view showing a fifth modification;
FIG. 28 is a plan view showing a sixth modification.

DETAILED DESCRIPTION

Figure 1:
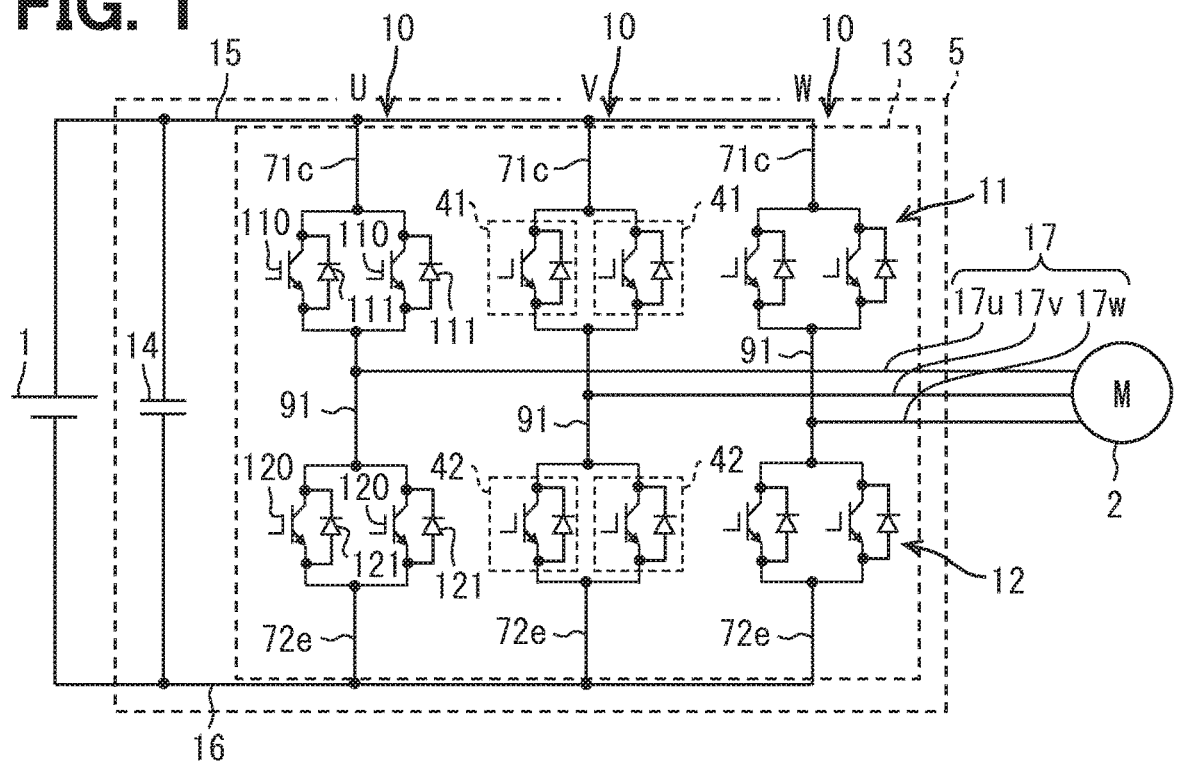
FIG. 1 is a circuit diagram showing a power converter according to a first embodiment.

In a conceivable power converter, the semiconductor device on the upper arm side has, as main terminals for providing an electric connecting function, a first high potential terminal connected to an electrode on a high potential side of the IGBT and a first low potential terminal connected to an electrode on a low potential side of the IGBT. In an alignment direction of the two semiconductor chips, the first high potential terminal is disposed to be biased toward one semiconductor chip side, and the first low potential terminal is disposed to be biased toward the remaining semiconductor chip side.

Similarly, the semiconductor device on the lower arm side has, as main terminals providing an electric connecting function, a second high potential terminal connected to the electrode on the high potential side of the IGBT and a second low potential terminal connected to the electrode on the low potential side of the IGBT. In the alignment direction of the two semiconductor chips, the second high potential terminal is disposed to be biased toward one semiconductor chip side, and the second low potential terminal is disposed to be biased toward the remaining semiconductor chip side.

For that reason, a current imbalance at the time of switching in a parallel circuit becomes a difficulty in both the upper arm and the lower arm.

On the other hand, it is also conceivable to configure the upper and lower arms with the use of two of the same semiconductor devices. However, the connection between the first low potential terminal and the second high potential terminal for connecting the upper and lower arms becomes complicated, and the inductance of the main circuit wiring may increase.

A power converter is provided to be capable of reducing an inductance of a main circuit wiring while inhibiting a current imbalance at the time of switching.

According to an example embodiment, a power converter includes: an upper and lower arm including an upper arm and a lower arm connected in series with each other; at least one first semiconductor device that includes a plurality of first semiconductor chips, each of which has a first switching element, and a plurality of first main terminals which are connected to the first semiconductor chips and provide an electric connection function, first switching elements being connected in parallel with each other to provide the upper arm, and the first main terminals including a first high potential terminal connected to an electrode of the first switching element on a high potential side and a first low potential terminal connected to an electrode of the first switching element on a low potential side; at least one second semiconductor device that includes a plurality of second semiconductor chips, each of which has a second switching element, and a plurality of second main terminals which are connected to the second semiconductor chips and provide an electric connection function, second switching elements being connected in parallel with each other to provide the lower arm, and the second main terminals including a second high potential terminal connected to an electrode of the second switching element on the high potential side and a second low potential terminal connected to an electrode of the second switching element on the low potential side; and a bridging member that bridges the first low potential terminal and the second high potential terminal, and provides an upper and lower coupling portion, which is a coupling portion between the upper arm and the lower arm, together with the first low potential terminal and the second high potential terminal. In the first semiconductor device, the first main terminals include at least one of a plurality of the first high potential terminals and a plurality of the first low potential terminals, the plurality of first semiconductor chips are arranged in line symmetry with respect to a first axis perpendicular to a first direction in which at least two of the first semiconductor chips are aligned, and the first high potential terminal and the first low potential terminal are arranged in line symmetry with respect to the first axis as a symmetry axis. In the second semiconductor device, the second main terminals include at least one of a plurality of the second high potential terminals and a plurality of the second low potential terminals, the plurality of second semiconductor chips are arranged in line symmetry with respect to a second axis perpendicular to a second direction in which at least two of the second semiconductor chips are aligned, and the second high potential terminal and the second low potential terminal are arranged in line symmetry with respect to the second axis as the symmetry axis to differentiate an arrangement of the second low potential terminal relative to the second high potential terminal from an arrangement of the first low potential terminal relative to the first high potential terminal.

According to the above power converter, at least one of the first high potential terminal and the first low potential terminal has three or more first main terminals as multiple terminals, and the first high potential terminal and the first low potential terminal are disposed line symmetrically with the first axis of the first semiconductor chip as a symmetry axis. Therefore, the wiring inductance can be made substantially equal in the parallel circuit on the upper arm side.

Similarly, at least one of the second high potential terminal and the second low potential terminal has three or more second main terminals as multiple terminals, and the second high potential terminal and the second low potential terminal are disposed line symmetrically with the second axis of the second semiconductor chip as a symmetry axis. Therefore, the wiring inductance can be made substantially equal in the parallel circuit on the lower arm side. As described above, in each of the first semiconductor device and the second semiconductor device configuring the upper and lower arms, the current imbalance at the time of switching can be inhibited.

The placement of the second low potential terminal with respect to the second high potential terminal is different from the placement of the first low potential terminal with respect to the first high potential terminal. As described above, the first semiconductor device on the upper arm side and the second semiconductor device on the lower arm side are of different types. Therefore, as compared with the case where the upper and lower arms are formed with the use of the same type of semiconductor device, for example, the connection structure of the first low potential terminal and the second high potential terminal can be simplified, and the inductance of the main circuit wiring can be reduced.

Multiple embodiments will be described with reference to the drawings. In the multiple embodiments, functionally and/or structurally corresponding parts are given the same reference numerals. Hereinafter, a thickness direction of the semiconductor chip is denoted as a Z-direction, and an alignment direction of the semiconductor chips is denoted as an X-direction. A direction orthogonal to both the Z-direction and the X-direction is denoted as a Y-direction. Unless otherwise specified, a shape along an XY plane defined by the X-direction and the Y-direction described above is a planar shape.

First Embodiment (Schematic Configuration of Power Converter)

A power converter 5 shown in FIG. 1 is mounted on, for example, an electric vehicle or a hybrid vehicle. The power converter 5 is configured to convert a DC power supplied from a DC power supply 1 mounted on the vehicle into a three-phase AC, and output the three-phase AC to a motor 2 of a three-phase AC system. The motor 2 functions as a travel driving source of the vehicle. The power converter 5 can also convert the electric power generated by the motor 2 into a direct current and charge the DC power supply 1 with the direct current. In this manner, the power converter 5 is configured to be capable of performing a bidirectional power conversion.

The power converter 5 includes an inverter 13 as a power conversion device configured by upper and lower arm circuits 10. The power converter 5 further includes a smoothing capacitor 14, a positive busbar 15, a negative busbar 16, and an output busbar 17.

In each of the upper and lower arm circuits 10, an upper arm circuit 11 and a lower arm circuit 12 are connected in series with each other with the upper arm circuit 11 as a high potential side. The upper and lower arm circuits 10 are also referred to as legs. The upper and lower arm circuit 10 corresponds to upper and lower arms, the upper arm circuit 11 corresponds to the upper arm, and the lower arm circuit 12 corresponds to the lower arm.

The upper arm circuit 11 has multiple switching elements each having a gate electrode, and the multiple switching elements are connected in parallel with each other. In the same manner, the lower arm circuit 12 has multiple switching elements each having a gate electrode, and the multiple switching elements are connected in parallel with each other. In the present embodiment, an n-channel insulated gate bipolar transistor (hereinafter referred to as an IGBT) is employed as the switching element.

The upper arm circuits 11 each have two IGBTs 110 and two diodes 111. The IGBTs 110 is connected in parallel with each other, and the diodes 111 are connected in anti-parallel with the respective IGBTs 110. The two IGBTs 110 connected in parallel to each other are driven simultaneously by one driver. In other words, the gate electrodes of the two IGBTs 110 are electrically connected to the same gate driver.

The lower arm circuits 12 each include two IGBTs 120 and two diodes 121. The IGBTs 120 are connected in parallel with each other, and the diodes 121 are connected in anti-parallel with the respective IGBTs 120. The two IGBT 120 connected in parallel to each other are electrically connected to the same gate driver.

Collector electrodes of the IGBTs 110 and cathode electrodes of the diodes 111 are electrically connected to a positive electrode of a smoothing capacitor 14 through a collector terminal C1 and the positive busbar 15, which will be described later. Emitter electrodes of the IGBTs 120 and anode electrodes of the diodes 121 are electrically connected to a negative electrode of the smoothing capacitor 14 through an emitter terminal E2 and the negative busbar 16, which will be described later. The emitter electrodes of the IGBT 110 and the anode electrodes of the diodes 111, and the collector electrodes of the IGBTs 120 and the anode electrodes of the diodes 121 are connected to a stator winding of the motor 2 through upper and lower coupling portions 91 and output busbars 17, which will be described later.

The inverter 13 converts the input DC power into a three-phase AC having a predetermined frequency, and outputs the three-phase AC to the motor 2. The inverter 13 converts an AC power generated by the motor 2 into a DC power. The inverter 13 includes the upper and lower arm circuits 10 for three phases.

The smoothing capacitor 14 smooths a DC voltage supplied from the DC power supply 1. The positive electrode of the smoothing capacitor 14 is connected to a positive electrode of the DC power supply 1, and the negative terminal of the smoothing capacitor 14 is connected to a negative electrode of the DC power supply 1. The positive busbar 15 is connected to the positive electrode of the smoothing capacitor 14, and the negative busbar 16 is connected to the negative electrode of the smoothing capacitor 14. The positive busbar 15 is a wiring connecting the positive electrode of the smoothing capacitor 14 and the collector terminal C1. The negative busbar 16 is a wiring connecting the negative electrode of the smoothing capacitor 14 and the emitter terminal E2.

The output busbars 17 are connected to middle points (connection points) between the upper arm circuits 11 and the lower arm circuits 12, and configure at least a part of a wiring connecting the inverter 13 and the stator winding of the motor 2. In the present embodiment, the output busbars 17 includes an output busbar 17u corresponding to a U-phase, an output busbar 17v corresponding to a V-phase, and an output busbar 17w corresponding to a W-phase of the inverter 13. The output busbars 17 correspond to wiring portions for connection to the motor 2 as a load.

In addition to the inverter 13 described above, the power converter 5 may include a boosting converter for boosting the DC voltage supplied from the DC power supply 1, a gate driver for controlling the operation of switching elements configuring the inverter 13 and the boosting converter.

(Semiconductor Modules Configuring Upper and Lower Arm Circuits)

Figure 2:
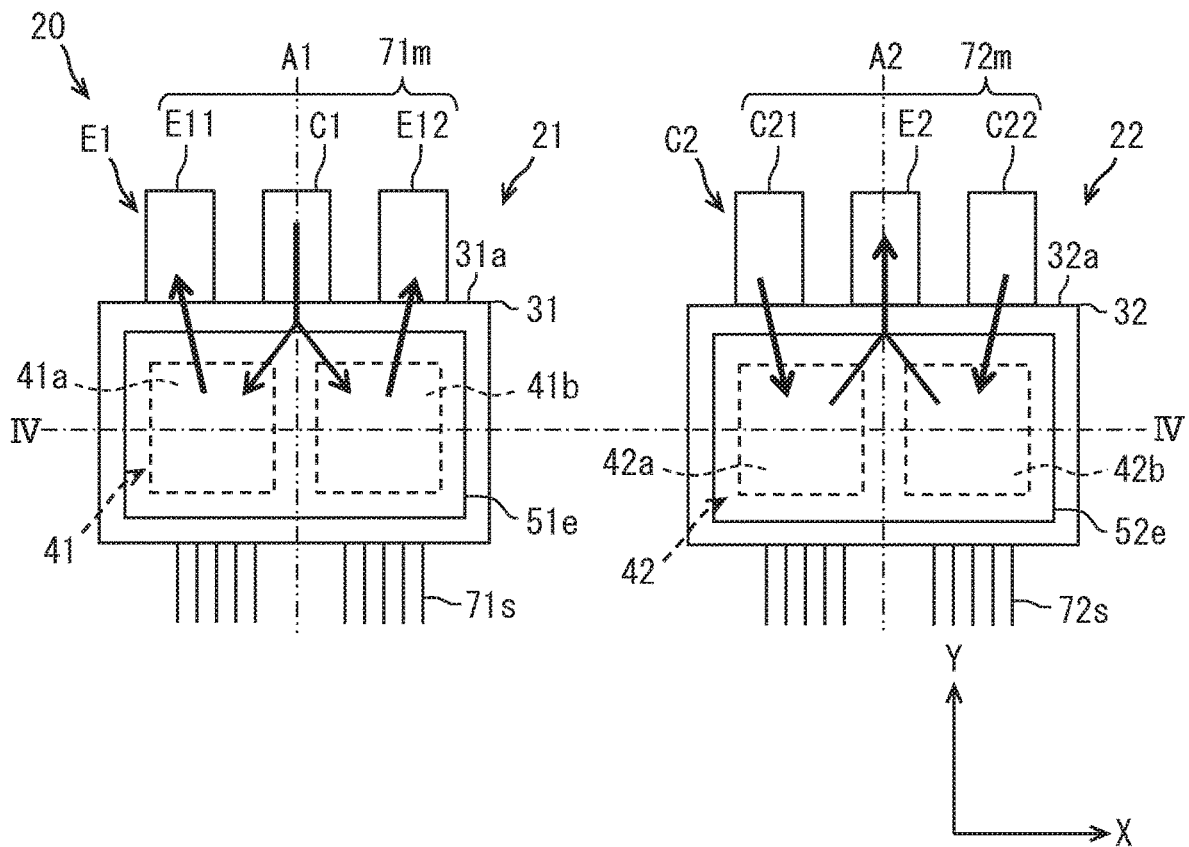
FIG. 2 is a plan view showing a semiconductor device.
Figure 3:
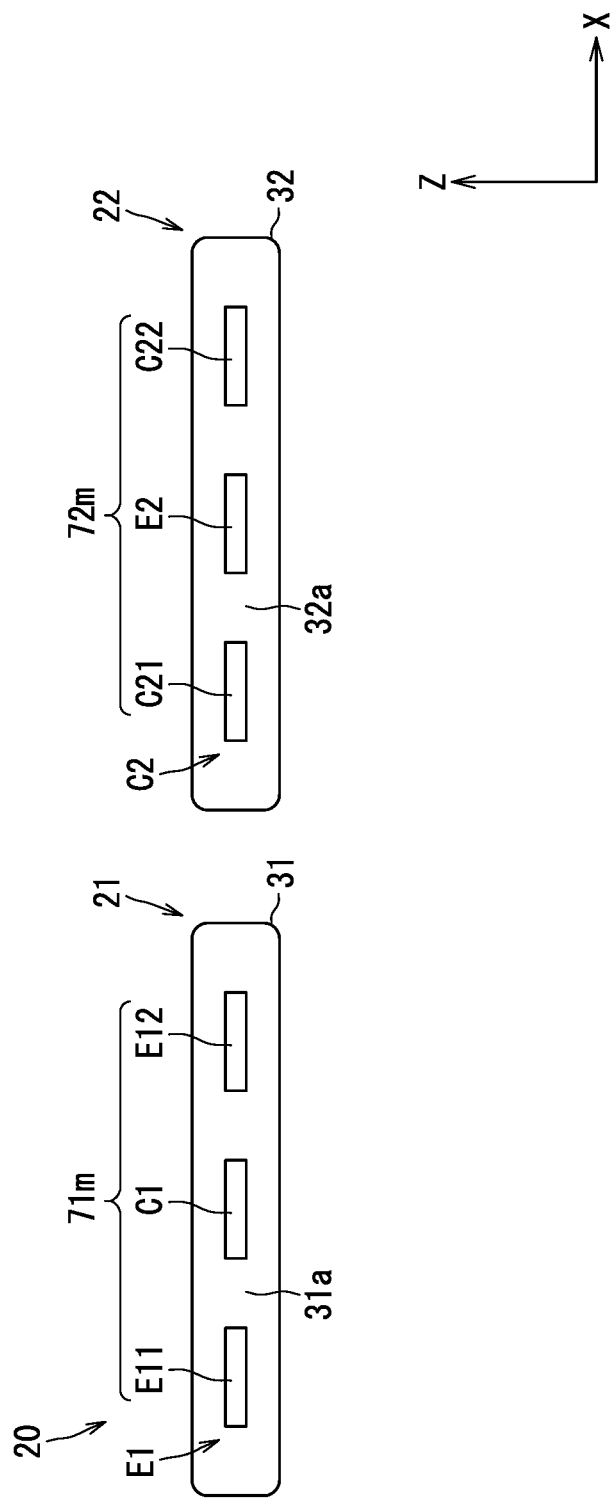
FIG. 3 is a plan view seen from a main terminal side.

The upper and lower arm circuits 10 are each configured with the use of a semiconductor device 20 shown in FIGS. 2 and 3. The semiconductor device 20 includes a first semiconductor device 21 configuring the upper arm circuit 11 and a second semiconductor device 22 configuring the lower arm circuit 12. Although the first semiconductor device 21 and the second semiconductor device 22 are stacked on each other as will be described later, the first semiconductor device 21 and the second semiconductor device 22 are aligned side by side in FIGS. 2 to 4 for convenience.

Figure 4:
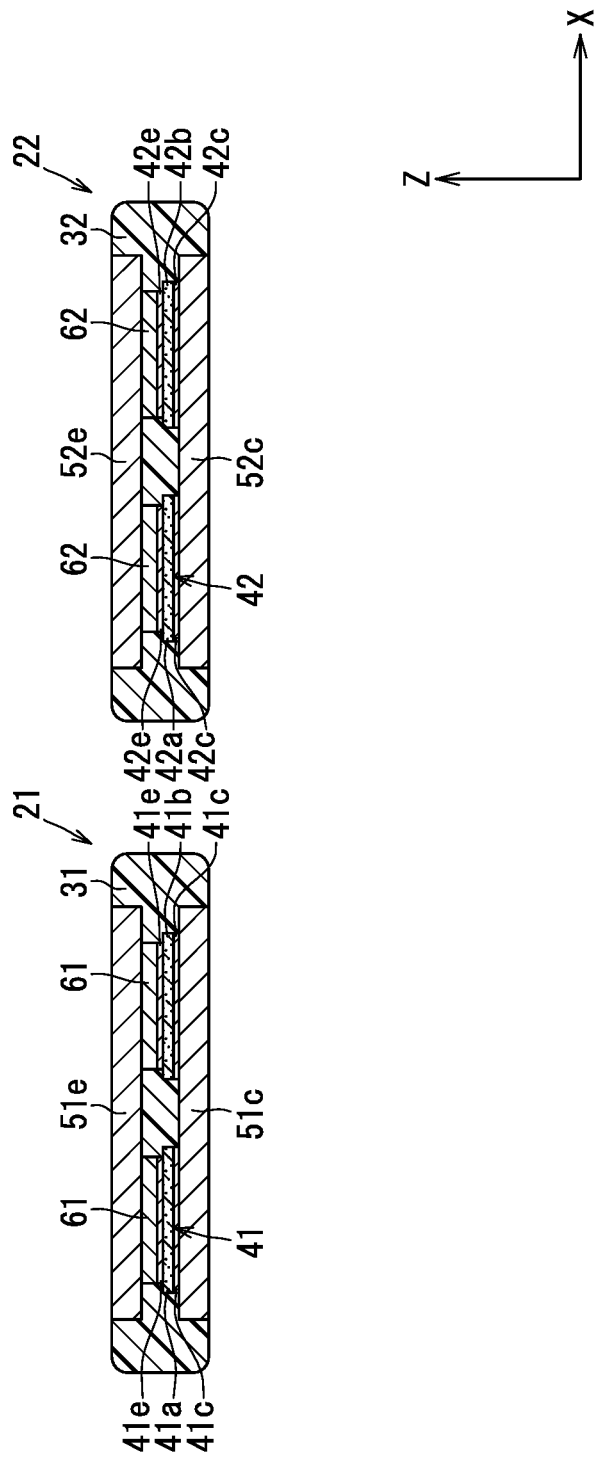
FIG. 4 is a cross-sectional view taken along a line IV-IV of FIG. 2.

First, the first semiconductor device 21 will be described. As shown in FIGS. 2 to 4, the first semiconductor device 21 includes a sealing resin body 31, semiconductor chips 41, heat sinks 51c, 51e, a terminal 61, and main terminals 71m and signal terminals 71s, which are external connection terminals.

The sealing resin body 31 seals the semiconductor chips 41 and the like. The sealing resin body 31 is made of, for example, an epoxy resin. The sealing resin body 31 is molded by, for example, a transfer molding method. The sealing resin body 31 has a substantially rectangular parallelepiped shape. The sealing resin body 31 has a substantially rectangular shape in plan view. The sealing resin body 31 corresponds to a first sealing resin body.

The IGBTs 110 and the diodes 111 are formed on the semiconductor chips 41. In other words, RC (Reverse Conducting)-IGBTs are formed on the semiconductor chips 41. The first semiconductor device 21 has two semiconductor chips 41 for forming a parallel circuit. Hereinafter, one of the semiconductor chips 41 is also referred to as a semiconductor chip 41a, and the other of the semiconductor chips 41 is also referred to as a semiconductor chip 41b. The semiconductor chips 41 correspond to first semiconductor chips, and the IGBTs 110 corresponds to first switching elements.

In each of the semiconductor chips 41, the IGBT 110 and the diode 111 have a vertical structure such that a current flows in the Z-direction. As shown in FIG. 4, in a plate thickness direction of the semiconductor chip 41, that is, in the Z-direction, a collector electrode 41c is formed on one surface of the semiconductor chip 41, and an emitter electrode 41e is formed on a back surface opposite to the one surface. The collector electrode 41c also serves as a cathode electrode of the diode 111, and the emitter electrode 41e also serves as an anode electrode of the diode 111. The collector electrode 41c corresponds to an electrode on a high potential side, and the emitter electrode 41e corresponds to an electrode on a low potential side.

The two semiconductor chips 41 have a structure substantially coincident with each other, that is, have the same shape and size. The semiconductor chip 41 has a substantially rectangular planar shape. The two semiconductor chips 41 are disposed so that the collector electrodes 41c are on the same side in the Z-direction. The two semiconductor chips 41 are positioned at substantially the same height in the Z-direction and are aligned side by side in the X-direction. The X-direction corresponds to a first direction.

As shown in FIG. 2, the two semiconductor chips 41 (41a, 41b) are aligned in line symmetry with a first axis A1 orthogonal to the X-direction and the Z-direction as a symmetry axis. In the present embodiment, the sealing resin body 31 has a substantially rectangular planar shape, and the two semiconductor chips 41 are disposed so that the first axis A1 substantially coincides with a center of an outer shape of the sealing resin body 31 in the X-direction.

Though not shown in the figure, a pad serving as a signal electrode is also formed on the back surface of the semiconductor chip 41, that is, the emitter electrode forming surface. The pad is formed at a position different from that of the emitter electrode 41e.

The heat sinks 51c and 51e function to dissipate a heat of the semiconductor chips 41 to the outside of the first semiconductor device 21, and also function as wirings. For that reason, in order to secure thermal conductivity and electrical conductivity, the heat sinks 51c and 51e are made of at least a metal material. The heat sinks 51c and 51e are also referred to as heat radiation plates. In the present embodiment, each of the heat sinks 51c and 51e is provided so as to include the two semiconductor chips 41 in a projection view from the Z-direction. The semiconductor chips 41 are disposed between the heat sinks 51c and 51e in the Z-direction. The heat sinks 51c and 51e are substantially rectangular in plan view with the X-direction as the longitudinal direction. A thickness of the heat sinks 51c and 51e is kept substantially constant, and a plate thickness direction of the heat sinks 51c and 51e is substantially parallel to the Z-direction.

As shown in FIG. 4, the heat sink 51c is connected to the collector electrode 41c, and the heat sink 51e is connected to the emitter electrode 41e. The heat sink 51c is connected to the collector electrode 41c through the connection member (not shown) such as solder. The heat sink 51e is connected to the emitter electrode 41e through the terminal 61 and a connection member (not shown).

Most of the heat sinks 51c and 51e are covered with the sealing resin body 31. In the surfaces of the heat sinks 51c and 51e, a surface opposite to the semiconductor chips 41 is exposed from the sealing resin body 31. In the Z-direction, the heat sink 51c is exposed from one surface of the sealing resin body 31, and the heat sink 51e is exposed from a surface opposite to the one surface.

The terminal 61 is interposed between the emitter electrode 41e of the semiconductor chip 41 and the heat sink 51e. The terminal 61 is provided for each of the semiconductor chips 41. The terminal 61 is located in the middle of a thermal conduction and electrical conduction path of the emitter electrode 41e and the heat sink 51e, and therefore the terminal 61 is made of at least a metal material in order to ensure the thermal conductivity and electrical conductivity. The terminal 61 is disposed to face the corresponding emitter electrode 41e, and is connected to the emitter electrode 41e through a connection member (not shown). The terminal 61 is connected to the heat sink 51e through a connection member (not shown).

The main terminal 71m is a terminal through which a main current flows among the external connection terminals. The main terminals 71m include a collector terminal C1 and emitter terminals E1. The collector terminal C1 is connected to the collector electrode 41c. The collector terminal C1 is connected to the collector electrode 41c through the heat sink 51c. The emitter terminals E1 are connected to the emitter electrode 41e. The emitter terminals E1 are connected to the emitter electrode 41e through the heat sink 51e and the terminal 61. The main terminals 71m corresponds to first main terminals, the collector terminal C1 corresponds to a first high potential terminal, and the emitter terminals E1 correspond to first low potential terminals.

In the present embodiment, the collector terminal C1 is integrally provided with the heat sink 51c by processing the same metal plate. The collector terminal C1 has a thickness smaller than that of the heat sink 51c, and is connected to a surface of the heat sink 51c opposite to the exposed surface in a substantially flush manner. The collector terminal C1 has a bent portion in the sealing resin body 31, and protrudes to the outside from the vicinity of the center in the Z-direction on one side surface 31a of the sealing resin body 31. In the same manner, the emitter terminals E1 are provided integrally with the heat sink 51e. The emitter terminals E1 protrude on the same side surface 31a as that of the collector terminal C1 to the outside from the vicinity of the center in the Z-direction. In other words, all the main terminals 71m protrude from the same side surface 31a.

The protruding portions of the collector terminal C1 and the emitter terminals E1 extend in the Y-direction. The plate thickness direction substantially coincides with the Z-direction, and the collector terminal C1 and the emitter terminals E1 are aligned side by side in the X-direction. In the present embodiment, as shown in FIG. 2, the main terminals 71m include the one collector terminal C1 and the two emitter terminals E1, and the collector terminal C1 is disposed between the emitter terminals E1 in the X-direction.

As described above, the first semiconductor device 21 has three main terminals 71m. Each of the collector terminal C1 and the emitter terminals E1 is arranged in line symmetry with the first axis A1 as a symmetry axis. The collector terminal C1 is disposed on the first axis A1, and the center of the width of the collector terminal C1 substantially coincides with the first axis A1. The two emitter terminals E1 are arranged in line symmetry with the first axis A1 as the symmetry axis. An emitter terminal E11 which is one of the emitter terminals E1 is disposed to be biased toward the semiconductor chip 41a side with respect to the first axis A1, and an emitter terminal E12 which is the other of the emitter terminals E1 is disposed to be biased toward the semiconductor chip 41b side with respect to the first axis A1.

The signal terminals 71s are connected to pads of the respective semiconductor chips 41. The signal terminals 71s is connected to the pads inside the sealing resin body 31 through, for example, bonding wires. The signal terminals 71s protrude to the outside from the side surface of the sealing resin body 31, more specifically, a surface opposite to the side surface 31a. The signal terminals 71s protrude in the Y-direction and in the opposite direction to the main terminals 71m.

In the first semiconductor device 21 configured as described above, the two semiconductor chips 41, a part of each of the heat sinks 51c and 51e, the terminal 61, a part of each of the multiple main terminals 71m, and a part of each of the multiple signal terminals 71s are integrally sealed with the sealing resin body 31.

Next, the second semiconductor device 22 will be described.

A basic configuration of the second semiconductor device 22 is the same as that of the first semiconductor device 21. As with the first semiconductor device 21, the second semiconductor device 22 also includes a sealing resin body 32, semiconductor chips 42, heat sinks 52c, 52e, a terminal 62, and main terminals 72m and signal terminal 72s which are external connection terminals.

The sealing resin body 32 seals the semiconductor chips 42 and the like. As with the sealing resin body 31, the sealing resin body 32 has a substantially rectangular parallelepiped shape. In the present embodiment, the sealing resin body 32 has a structure substantially coincident with the sealing resin body 31, that is, has the same shape and size. The sealing resin body 32 corresponds to a second sealing resin body.

The IGBTs 120 and the diodes 121 are formed on the semiconductor chips 42. An RC-IGBT is formed on the semiconductor chip 42. The second semiconductor device 22 has two semiconductor chips 42 for forming a parallel circuit. Hereinafter, one of the semiconductor chips 42 is referred to as a semiconductor chip 42a, and the other of the semiconductor chips 42 is also referred to as a semiconductor chip 42b. The semiconductor chips 42 corresponds to second semiconductor chips, and the IGBTs 120 corresponds to second switching elements.

The two semiconductor chips 42 have a structure substantially coincident with each other, that is, have the same shape and size. In the present embodiment, the semiconductor chip 42 has a structure substantially coincident with the semiconductor chip 41. The two semiconductor chips 42 are disposed so that the collector electrodes 42c are on the same side in the Z-direction. The two semiconductor chips 42 are positioned at substantially the same height in the Z-direction and are aligned side by side in the X-direction. The X-direction corresponds to a second direction.

As shown in FIG. 2, the two semiconductor chips 42 (42a, 42b) are aligned in line symmetry with a second axis A2 orthogonal to the X-direction and the Z-direction as a symmetry axis. In the present embodiment, the sealing resin body 32 has a substantially rectangular planar shape, and the two semiconductor chips 42 are disposed so that the second axis A2 substantially coincides with a center of an outer shape of the sealing resin body 32 in the X-direction.

The heat sinks 52c and 52e function to dissipate a heat of the semiconductor chips 42 to the outside of the second semiconductor device 22, and also function as wirings. In the present embodiment, each of the heat sinks 52c and 52e is provided so as to include the two semiconductor chips 42 in a projection view from the Z-direction. The semiconductor chips 42 are disposed between the heat sinks 52c and 52e in the Z-direction.

As shown in FIG. 4, the heat sink 52c is connected to the collector electrode 42c, and the heat sink 52e is connected to the emitter electrode 42e. Most of the heat sinks 52c and 52e are covered with the sealing resin body 32. In the surfaces of the heat sinks 52c and 52e, a surface opposite to the semiconductor chips 42 is exposed from the sealing resin body 32. In the Z-direction, the heat sink 52c is exposed from one surface of the sealing resin body 32, and the heat sink 52e is exposed from a surface opposite to the one surface.

The terminal 62 is interposed between the emitter electrode 42e of the semiconductor chip 42 and the heat sink 52e. The terminal 62 is provided for each of the semiconductor chips 42. The terminal 62 is disposed to face the corresponding emitter electrode 42e, and is connected to the emitter electrode 42e through a connection member (not shown). The terminal 62 is connected to the heat sink 52e through a connection member (not shown).

The main terminal 72m is a terminal through which a main current flows among the external connection terminals. The main terminals 72m include collector terminals C2 and an emitter terminal E2. The collector terminals C2 are connected to the collector electrode 42c. The collector terminals C2 is connected to the collector electrode 42c through the heat sink 52c. The emitter terminal E2 is connected to the emitter electrode 42e. The emitter terminal E2 is connected to the emitter electrode 42e through the heat sink 52e and the terminal 62. The main terminals 72m correspond to second main terminals, the collector terminals C2 correspond to second high potential terminals, and the emitter terminal E2 corresponds to a second low potential terminal.

In the present embodiment, the collector terminals C2 are also provided integrally with the heat sink 52c. The collector terminals C2 protrude on one side surface 32a of the sealing resin body 32 to the outside from the vicinity of the center in the Z-direction. In the same manner, the emitter terminal E2 is provided integrally with the heat sink 52e. The emitter terminal E2 protrudes on the same side surface 32a as that of the collector terminal C1 to the outside from the vicinity of the center in the Z-direction. In other words, all the main terminals 72m protrude from the same side surface 32a.

The protruding portions of the collector terminals C2 and the emitter terminal E1 extend in the Y-direction. The plate thickness direction substantially coincides with the Z-direction, and the collector terminal C2 and the emitter terminals E2 are aligned side by side in the X-direction. In the present embodiment, as shown in FIG. 2, the main terminal 72m includes two collector terminals C2 and one emitter terminal E2. In other words, the main terminal 72m has the same number of emitter terminals E2 as the collector terminal C1, and has the same number of collector terminals C2 as the emitter terminal E1.

The second semiconductor device 22 has three main terminals 72m. The emitter terminal E2 is disposed between the collector terminals C2 in the X-direction. The collector terminal C2 and the emitter terminals E2 are arranged in line symmetry with the second axis A2 as a symmetry axis. The emitter terminal E2 is disposed on the second axis A2, and the center of a width of the emitter terminal E2 substantially coincides with the second axis A2. The two collector terminals C2 are arranged in line symmetry with the second axis A2 as the symmetry axis. A collector terminal C21, which is one of the collector terminals C2, is disposed to be biased toward the semiconductor chip 42a side relative to the second axis A2 in the X-direction, and a collector terminal C22, which is the other of the collector terminals C2, is disposed to be biased toward the semiconductor chip 42b side relative to the second axis A2.

In particular, in the present embodiment, a distance from the second axis A2 to the center of the collector terminals C2 in the width direction is substantially equal to a distance from the first axis A1 to the center of the emitter terminal E1 in the width direction. In other words, although the alignment of the collector terminals C1, C2 and the emitter terminals E1, E2 is different, the main terminals 71m and 72m are arranged in the same manner.

The signal terminals 72s are connected to pads of the respective semiconductor chips 42. The signal terminals 72s protrude to the outside from a surface opposite to the side surface 32a of the sealing resin body 32. The signal terminals 71s protrude in the Y-direction and in the opposite direction to the main terminals 71m.

Next, a connection structure between the first semiconductor device 21 and the second semiconductor device 22 will be described.

Figure 5:
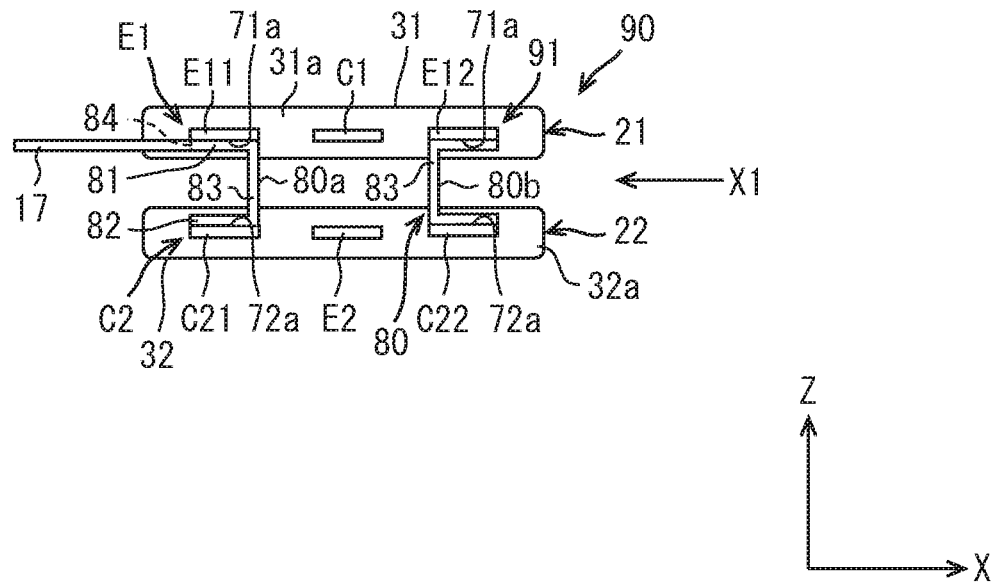
FIG. 5 is a plan view of a semiconductor module as viewed from the main terminal side.
Figure 6:
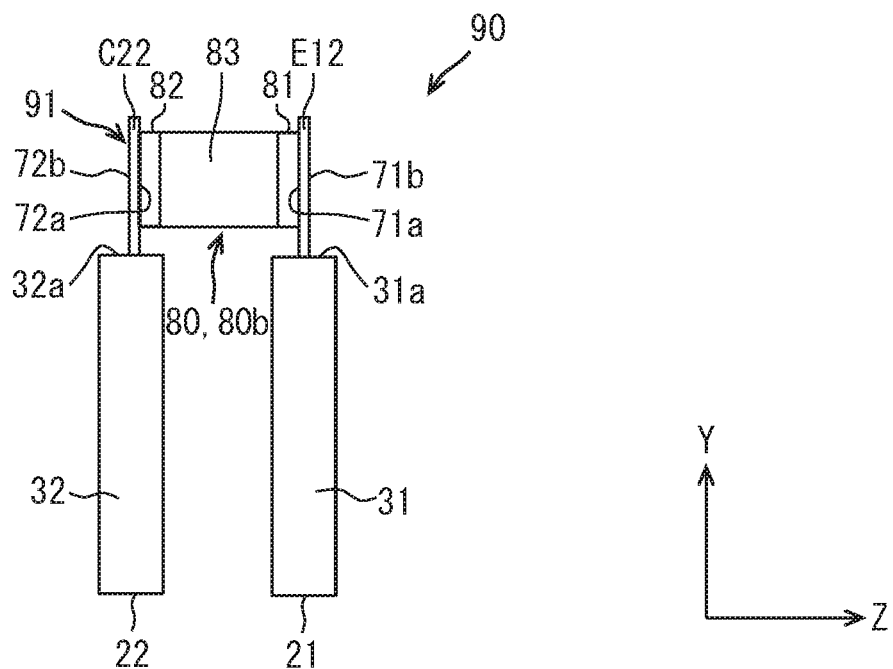
FIG. 6 is a plan view of FIG. 5 as viewed from a direction X1.

As shown in FIGS. 5 and 6, the first semiconductor device 21 and the second semiconductor device 22 are connected to each other by a bridging member 80, thereby forming a semiconductor module 90. The semiconductor module 90 configures the upper and lower arm circuits 10, that is, one phase of the inverter 13. The power converter 5 includes the semiconductor module 90.

The bridging member 80 bridges the emitter terminals E1 of the first semiconductor device 21 and the collector terminals C2 of the second semiconductor device 22, and connects the upper arm circuit 11 and the lower arm circuit 12 in series. The bridging member 80, together with the emitter terminals E1 and the collector terminals C2, forms an upper and lower coupling portion 91 which is a coupling part between the upper arm circuit 11 and the lower arm circuit 12. The bridging member 80 is formed by processing a metal plate. The bridging member 80 is also referred to as a connecting busbar. The emitter terminals E1 and the collector terminals C2 correspond to coupling terminals.

The bridging members 80 include a connection portion 81 which is a connection portion with the emitter terminals E1, a connection portion 82 which is a connection portion with the collector terminals C2, and a connecting portion 83 which connects the connection portions 81 and 82 to each other. The connection portions 81 and 82 are connected to each other by, for example, laser welding. In the present embodiment, the first semiconductor device 21 has the two emitter terminals E1, and the second semiconductor device 22 has the two collector terminals C2. The first semiconductor device 21 and the second semiconductor device 22 are connected to each other by the two bridging members 80. The semiconductor module 90 has two upper and lower coupling portions 91. A bridging member 80a, which is one of the bridging members 80, connects the emitter terminal E11 and the collector terminal C21. A bridging member 80b, which is the other of the bridging members 80, connects the emitter terminal E12 and the collector terminal C22.

The first semiconductor device 21 and the second semiconductor device 22 configuring the upper and lower arm circuits 10 are stacked on each other so as to be adjacent to each other in the Z-direction which is the plate thickness direction of the semiconductor chips 41 and 42. In this stacked state, the collector terminal C1 and the emitter terminal E2 are opposed to each other, and the emitter terminal E1 and the collector terminal C2 are also opposed to each other. In this example, "opposed" includes that at least a part is opposed to each other. In the present embodiment, in the corresponding main terminals 71m and 72m, the protruding portion from the sealing resin body 31 and the protruding portion from the sealing resin body 32 are opposed to each other in substantially the entire area.

The connection portions 81 and 82 extend in the X-direction, that is, in the width direction of the emitter terminal E1 and the collector terminal C2. The connecting portion 83 is continued to end portions of the connection portions 81 and 82 on the same side in the X-direction. The plate thickness direction of the connecting portion 83 is the X-direction. The bridging member 80 has a substantially U-shaped shape.

The bridging members 80 are disposed so that the plate thickness direction of the connection portions 81 and 82 is the Z-direction. Plate surfaces of the connection portions 81 and 82 are connected to the respective emitter terminal E1 and collector terminal C2. The plate surface is a surface that is substantially orthogonal to the plate thickness direction of the connection portions 81 and 82. The connection portion 81 is connected to an inner surface 71a of the emitter terminal E1. The connection portion 82 is connected to an inner surface 72a of the collector terminal C2. The inner surfaces 71a and 72a are surfaces on a side where the main terminals 71m and 72m are opposed to each other, and the outer surfaces 71b and 72b are surfaces on opposite sides of the inner surfaces 71a and 72a. The connection portion 81 corresponds to a first connection portion, and the connection portion 82 corresponds to a second connection portion.

In the present embodiment, the bridging members 80 having the same structure are employed in the two upper and lower coupling portions 91. Then, the two bridging members 80 have a positional relationship in which the bridging members 80 are reversed 180 degrees, and are connected to the emitter terminal E1 and the collector terminal C2 so that the connecting portions 83 approach each other in the X-direction.

The bridging member 80a is connected to the output busbar 17. The same metal plate is processed so that the output busbar 17 is provided integrally with the bridging member 80a. In this manner, the output busbar 17 is integrated with the semiconductor module 90. The output busbar 17 is connected to an end surface 84 of the bridging member 80a. The end surface 84 is a plane parallel to the plate thickness direction, that is, a plane substantially orthogonal to the plate surface. The output busbar 17 is an extension portion drawn out from the end surface 84. In the present embodiment, the output busbar 17 is connected to the end surface 84 of the connection portion 81. In this manner, the output busbar 17 is drawn out from only a part of the multiple upper and lower coupling portions 91, specifically, from only one of the two upper and lower coupling portions 91.

Next, the effects of the power converter 5 including the semiconductor module 90 will be described.

Hereinafter, the IGBT 110 formed on the semiconductor chip 41a is also referred to as an IGBT 110a, and the IGBT 110 formed on the semiconductor chip 41b is also referred to as an IGBT 110b. The IGBT 120 formed on the semiconductor chip 42a is also referred to as an IGBT 120a, and the IGBT 120 formed on the semiconductor chip 42b is also referred to as an IGBT 120b.

Figure 7:
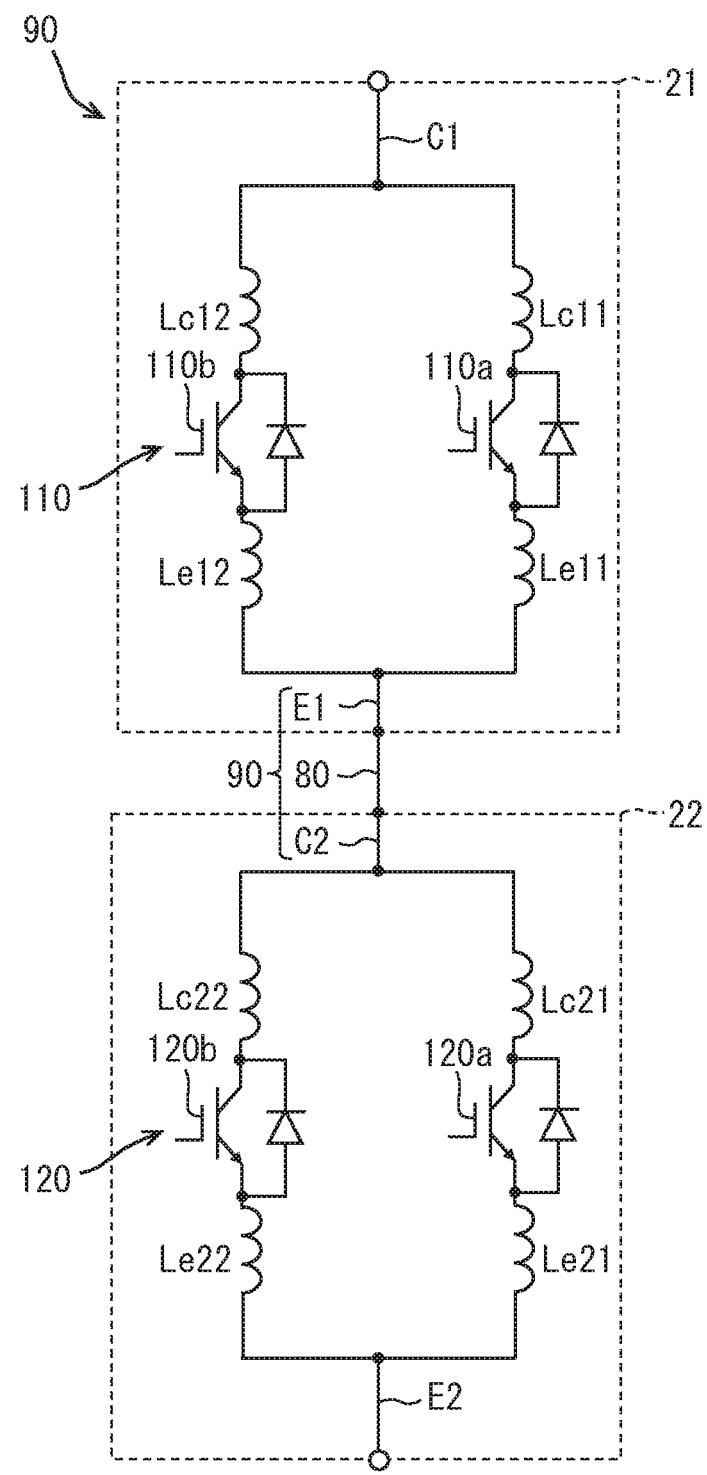
FIG. 7 is an equivalent circuit diagram of a semiconductor module considering inductance.

FIG. 7 shows an equivalent circuit diagram in consideration of a wiring inductance of the semiconductor module 90, that is, the upper and lower arm circuit 10. In the parallel circuit on the upper arm side, Lc 11 represents a wiring inductance on the collector side of the IGBT 110a, and Lc 12 represents a wiring inductance on the collector side of the IGBT 110b. Le 11 represents a wiring inductance on the emitter side of the IGBT 110a, and Le 12 represents a wiring inductance on the emitter side of the IGBT 110b. In the parallel circuit on the lower arm side, Lc 21 represents a wiring inductance on the collector side of the IGBT 120a, and Lc 22 represents a wiring inductance on the collector side of the IGBT 110b. Le 21 represents a wiring inductance on the emitter side of the IGBT 120a, and Le 22 represents a wiring inductance on the emitter side of the IGBT 120b.

The first semiconductor device 21 has at least one of the multiple collector terminals C1 on the high potential side and the multiple emitter terminals E1 on the low potential side. The multiple semiconductor chips 41 are arranged in line symmetry with respect to the first axis A1 orthogonal to the alignment direction of the at least two semiconductor chips 41 (41a, 41b). The collector terminal C1 and the emitter terminal E1 are arranged in line symmetry with the first axis A1 as the symmetry axis.

As a result, a current path of the collector terminal C1, the semiconductor chip 41a (IGBT 110a), and the emitter terminal E11 in a stated order and a current path of the collector terminal C1, the semiconductor chip 41b (IGBT 110b), and the emitter terminal E12 in a stated order become substantially line symmetric with the first axis A1 as the symmetry axis as shown in FIG. 2. Therefore, the wiring inductances Lc 11 and Lc 12 on the collector side can be set to be substantially equal to each other, and the wiring inductances Le 11 and Lc 12 on the emitter side can be set to be substantially equal to each other.

In the same manner, the second semiconductor device 22 has at least one of the multiple collector terminals C2 on the high potential side and the multiple emitter terminals E2 on the low potential side. The multiple semiconductor chips 42 are arranged in line symmetry with respect to the second axis A2 orthogonal to the X-direction, which is the alignment direction of the at least two semiconductor chips 42. The collector terminal C2 and the emitter terminal E2 are arranged in line symmetry with the second axis A2 as the symmetry axis.

As a result, a current path of the collector terminal C21, the semiconductor chip 42a (IGBT 120a), and the emitter terminal E2 in a stated order and a current path of the collector terminal C22, the semiconductor chip 42b (IGBT 120b), and the emitter terminal E2 in a stated order become substantially line symmetric with the second axis A2 as the symmetry axis as shown in FIG. 2. Therefore, the wiring inductances Lc 21 and Lc 22 can be set to be substantially equal to each other, and the wiring inductances Le 21 and Le 22 can be set to be substantially equal to each other.

As described above, in each of the first semiconductor device 21 and the second semiconductor device 22 configuring the upper and lower arm circuits 10, a current imbalance at the time of switching can be inhibited.

The main terminal 71m has one collector terminal C1 and two emitter terminals E1, and the collector terminal C1 is disposed between the emitter terminals E1. On the other hand, the main terminal 72m has one emitter terminal E2 and two collector terminals C2, and the emitter terminal E2 is disposed between the collector terminals C2. As described above, the placement of the high potential terminal (collector terminal) and the low potential terminal (emitter terminal) is different between the first semiconductor device 21 and the second semiconductor device 22. Therefore, as compared with the case where the upper and lower arm circuits are formed with the use of the same type (one type) of semiconductor device, for example, a connection structure of the emitter terminal E1 and the collector terminal C2 can be simplified, and the inductance of the main circuit wiring can be reduced. This makes it possible to reduce a surge voltage generated at the time of switching. The main circuit is a circuit including the smoothing capacitor 14 and the upper and lower arm circuits 10.

As described above, according to the power converter 5 (semiconductor module 90) of the present embodiment, the inductance of the main circuit wiring can be reduced while inhibiting the current imbalance at the time of switching. In particular, in the present embodiment, since the first axis A1 substantially coincides with the center of the outer shape of the sealing resin body 31 in the X-direction, the above-mentioned effects can be achieved while reducing a body size of the first semiconductor device 21. In the same manner, since the second axis A2 substantially coincides with the center of the outer shape of the sealing resin body 32 in the X-direction, the above-described effects can be achieved while reducing the body size of the second semiconductor device 22.

Further, in the present embodiment, the number of collector terminals C1 is the same as the number of emitter terminals E2, and the number of emitter terminals E1 is the same as the number of collector terminals C2. As a result, the connection between the upper arm circuit 11 and the lower arm circuit 12 and the connection between the smoothing capacitor 14 and each of the upper arm circuit 11 and the lower arm circuit 12 can be simplified as compared with a configuration in which the number of the main terminals 71m and 72m is different from each other. As a result, the inductance of the main circuit wiring can be reduced.

In particular, the multiple emitter terminals E1 and the multiple collector terminals C2 for vertical connection are provided, and the multiple vertical coupling portions 91 are formed by multiple bridging members 80. Specifically, the same number of upper and lower coupling portions 91 as the number of semiconductor chips 41 are formed. In this manner, since the upper and lower coupling portions 91 are also disposed in parallel to each other, the inductance of the main circuit wiring can be reduced with an increase in the current path.

The output busbar 17 for connection to the motor 2 is integrated with the semiconductor module 90 configuring the upper and lower arm circuits 10. The output busbar 17 is pulled out from only a part of the multiple upper and lower coupling portions 91. Therefore, the inductance of the main circuit wiring can be reduced while simplifying the structure of connection to the motor 2, which is a load. In the present embodiment, an example in which the output busbar 17 is provided integrally with the bridging member 80a is shown, but the present disclosure is not limited to the above example. The output busbar 17 may be a member separate from the bridging member 80a.

Incidentally, when the output busbar 17 is connected to the plate surface of the bridging member 80a, the wiring inductance may be changed by the connection, and the effects of inhibiting the current imbalance may be reduced. In the present embodiment, the output busbar 17 is drawn out from the end surface 84, not the plate surface of the bridging member 80a. In other words, the output busbar 17 is extracted from a part that does not affect a change in the di/dt. Therefore, even in the structure in which the output busbar 17 is integrated only with the bridging member 80a, the current imbalance at the time of switching can be inhibited.

In the multiple upper and lower coupling portions 91, the bridging member 80 having the same structure is used. As a result, the effects of inhibiting the current imbalance can be enhanced. In particular, the present embodiment employs the positional relationship in which the two bridging members 80 are reversed by 180 degrees. In other words, the two bridging members 80 are disposed in opposite directions. As a result, the symmetry can be enhanced and the current imbalance can be further inhibited.

All the main terminals 71m project from the side surface 31a of the sealing resin body 31 and are aligned along the alignment direction of the semiconductor chips 41. All the main terminals 72m project from the side surface 32a of the sealing resin body 32 and are aligned along the alignment direction of the semiconductor chips 42. As a result, the connection between the upper arm circuit 11 and the lower arm circuit 12 and the connection between the smoothing capacitor 14 and each of the upper arm circuit 11 and the lower arm circuit 12 can be simplified, and the inductance of the main circuit wiring can be reduced.

In particular, the three main terminals 71m are provided, and the collector terminal C1 is disposed between the two emitter terminals E1. The three main terminals 72m are provided, and the emitter terminal E2 is disposed between the two collector terminals C2. This can simplify the configuration. In other words, the inductance of the main circuit wiring can be more effectively reduced while inhibiting the current imbalance. In addition, the body size of the power converter 5 (semiconductor module 90) can be reduced.

Further, the first semiconductor device 21 and the second semiconductor device 22 are stacked on each other so that the first semiconductor device 21 and the second semiconductor device 22 configuring the upper and lower arm circuits 10 are adjacent to each other. At least one of the collector terminal C1 and the emitter terminal E2, and the emitter terminal E1 and the collector terminal C2 faces each other at least partially in the stacking direction. Since a current in the opposite direction flows through the opposing terminals, the inductance of the main circuit wiring can be reduced by the effects of magnetic flux cancellation.

In the present embodiment, the protruding portions of the collector terminal C1 and the emitter terminal E2 face each other in substantially the entire area, and the protruding portions of the emitter terminal E1 and the collector terminal C2 face each other in substantially the entire area. Therefore, the inductance of the main circuit wiring can be effectively reduced. In addition, the connection between the upper arm circuit 11 and the lower arm circuit 12 can be simplified by the opposing placement of the emitter terminal E1 and the collector terminal C2.

The heat sinks 51c and 51e are shared by the semiconductor chips 41. This makes it possible to inhibit a voltage fluctuation between the IGBTs 110. In the same manner, since the heat sinks 52c and 52e are shared by the semiconductor chips 42, the voltage fluctuation between the IGBTs 120 can be inhibited. Furthermore, the number of parts can be reduced.

(Connection Structure of Semiconductor Module and Smoothing Capacitor)

Figure 9:
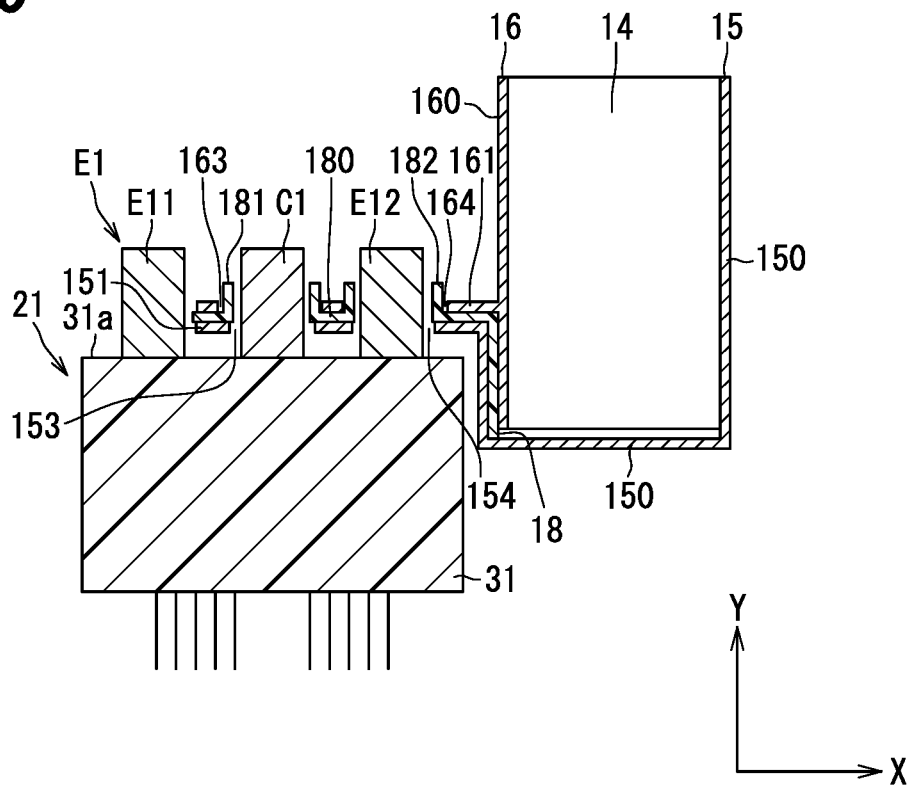
FIG. 9 is a cross-sectional view taken along a line IX-IX of FIG. 8.
Figure 10:
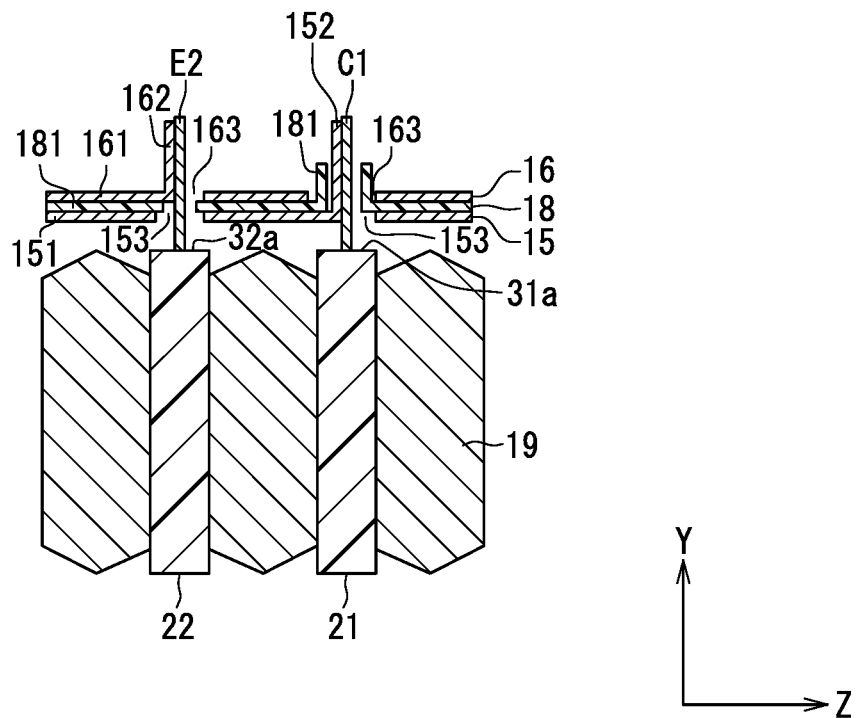
FIG. 10 is a cross-sectional view taken along a line X-X of FIG. 8.

In the following description, as a positional relationship in the Y-direction, for example, positions of the collector terminal C1 and the emitter terminal E1 with respect to the signal terminal 71s are indicated as a top, and a position of the signal terminal 71s with respect to the collector terminal C1 and the emitter terminal E1 is indicated as a bottom. In FIGS. 9 and 10, for convenience, the first semiconductor device 21 and the cooler 19 are illustrated in a simplified manner. In addition, an internal structure sealed in the sealing resin bodies 31 and 32 is omitted.

Figure 8:
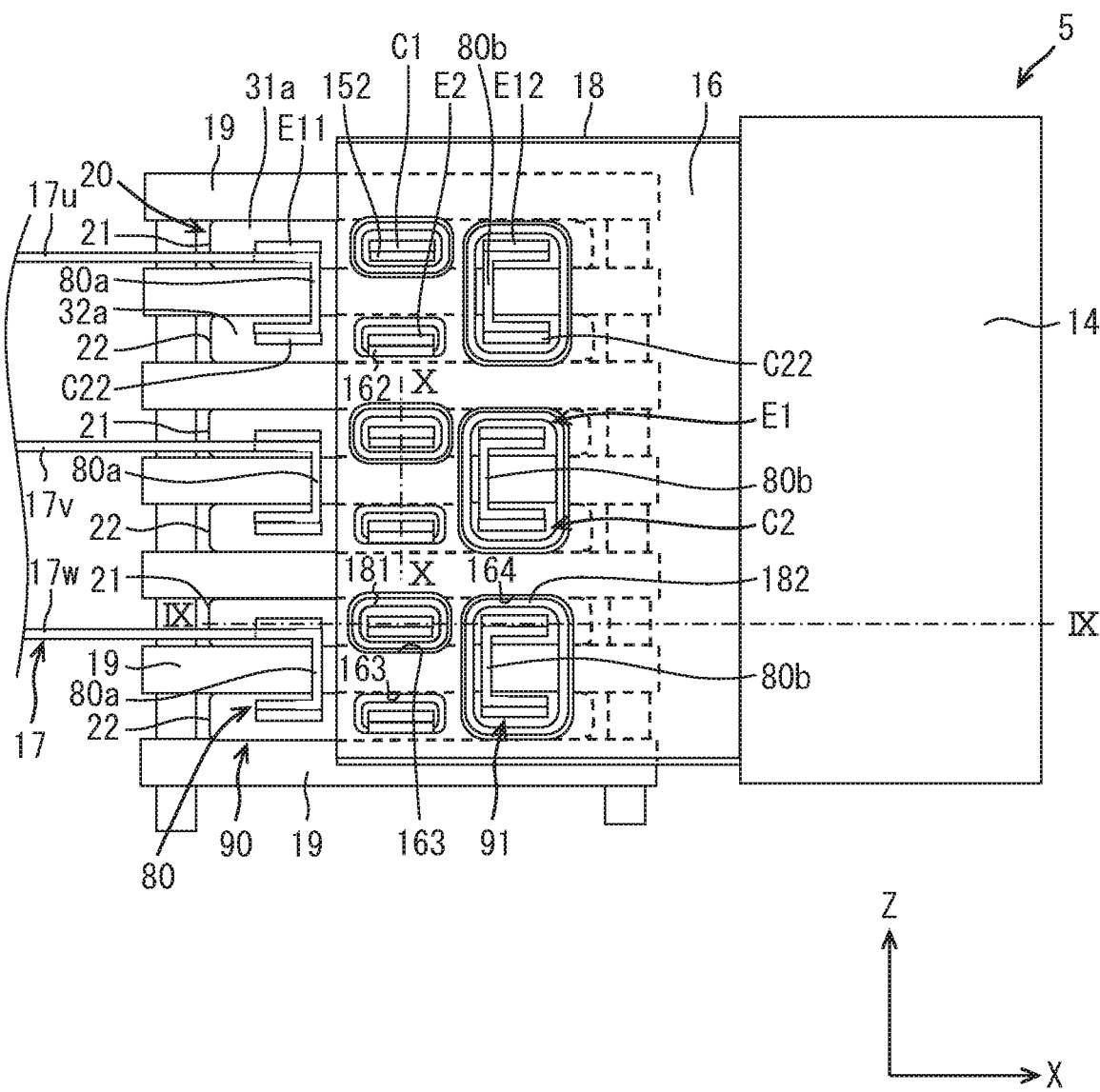
FIG. 8 is a plan view showing a schematic configuration of the power converter.

As shown in FIGS. 8 to 10, the power converter 5 includes three semiconductor modules 90 in order to configure the inverter 13, that is, the upper and lower arm circuits 10 for three phases. In other words, the semiconductor device 20 includes three first semiconductor devices 21 and three second semiconductor devices 22. The first semiconductor devices 21 and the second semiconductor devices 22 are alternately disposed so that the heat sinks 51c and 52c on the collector side face the same side in the Z-direction, which is the stacking direction. The three semiconductor modules 90 are aligned in the order of a U-phase, a V-phase, and a W-phase in the Z-direction. Therefore, the output busbars 17 are also disposed in the order of the U-phase output busbar 17u, the V-phase output busbar 17v, and the W-phase output busbar 17w. The multiple semiconductor devices 20 are disposed at substantially regular intervals in the Z-direction.

The collector terminals C1 and the emitter terminals E2 connected to the smoothing capacitor 14 are aligned along the Z-direction. The collector terminals C1 and the emitter terminals E2 are alternately disposed. The collector terminal C1 is also referred to as a positive electrode terminal (P terminal), and the emitter terminal E2 is also referred to as a negative electrode terminal (N terminal). The emitter terminals E1 and the collector terminals C2 are aligned along the Z-direction on both sides of the collector terminals C1 and the emitter terminals E2. The emitter terminals E1 and the collector terminals C2 are also alternately disposed.

The power converter 5 includes the smoothing capacitor 14, the positive busbar 15, the negative busbar 16, the insulation member 18, and the coolers 19. The smoothing capacitor 14 has a positive electrode (not shown) on one side in the X-direction and a negative electrode (not shown) on a back side opposite to the one side. The back surface on which the negative electrode is formed is a surface on the semiconductor module 90 side in the X-direction.

The positive busbar 15 is a wiring portion that connects the positive electrode of the smoothing capacitor 14 and the collector terminal C1. The positive busbar 15 includes a facing portion 150, a laminated portion 151, and a protruding portion 152. The negative busbar 16 is a wiring portion that connects the negative electrode of the smoothing capacitor 14 and the emitter terminal E2. The negative busbar 16 has a facing portion 160, a laminated portion 161, and a protruding portion 162.

The facing portions 150 and 160 are portions connected to the electrodes of the smoothing capacitor 14. The facing portion 150 is disposed so as to face the positive electrode of the smoothing capacitor 14, and is connected to the positive electrode. The facing portion 160 is disposed to face the negative electrode of the smoothing capacitor 14, and is connected to the negative electrode.

The laminated portions 151 and 161 are stacked on each other through the insulation member 18. The positive busbar 15 and the negative busbar 16 are stacked on each other, thereby being capable of reducing an inductance of the main circuit wiring by canceling a magnetic flux. In the present embodiment, a part of the facing portion 160 also serves as the laminated portion 161.

Parts of the laminated portions 151 and 161 extend from the smoothing capacitor 14 side toward the semiconductor module 90 in the X-direction. The extension portions of the laminated portions 151 and 161 in the X-direction are disposed above the side surfaces 31a and 32a of the sealing resin bodies 31 and 32 in the Y-direction. The laminated portions 151 and 161 overlap with the collector terminal C1 and the emitter terminal E2 in a projection view in the Y-direction, and extend so as not to overlap with the emitter terminal E11 and the collector terminal C11 located away from the smoothing capacitor 14.

Through holes 153 and 154 are provided in the extension portion of the laminated portion 151. The collector terminal C1 and the emitter terminal E2 are inserted through the through holes 153 from the bottom to the top in the Y-direction. The collector terminal C1 and the emitter terminal E2 are individually disposed in the through holes 153. The laminated portion 151 is provided with the same number of through holes 153 as the total number of collector terminals C1 and emitter terminals E2.

The protruding portion 152 protrudes upward in the Y-direction from an opening edge portion of the through hole 153 through which the collector terminal C1 is inserted. The protruding portion 152 is bent so that the plate thickness direction is the Z-direction. The protruding portion 152 is inserted through a through hole 163 to be described later, and is surface-connected to the collector terminal C1 above the negative busbar 16.

The emitter terminal E12 and the collector terminal C22 are inserted through the through hole 154. The emitter terminal E12 and the collector terminal C22 of the same semiconductor module 90 are disposed in the same through hole 154.

Likewise, through holes 163 and 164 are provided in the extension portion of the laminated portion 161. The collector terminal C1 and the emitter terminal E2 are inserted through the through holes 163 from the bottom to the top in the Y-direction. The collector terminal C1 and the emitter terminal E2 are individually disposed in the through holes 163. The laminated portion 161 is provided with the same number of through holes 163 as the total number of collector terminals C1 and emitter terminals E2.

The protruding portion 162 protrudes upward in the Y-direction from an opening edge portion of the through hole 163 through which the emitter terminal E2 is inserted. The protruding portion 162 is bent so that the plate thickness direction is the Z-direction. The protruding portion 162 is surface-connected to the emitter terminal E2. The protruding portion 162 is connected to the emitter terminal E2 on the same surface side as the protruding portion 152 with respect to the collector terminal C1.

The emitter terminal E12 and the collector terminal C22 are inserted through the through hole 164. The emitter terminal E12 and the collector terminal C22 of the same semiconductor module 90 are disposed in the same through hole 164. At least a part of the bridging member 80b bridging the emitter terminal E12 and the collector terminal C22 is disposed above the laminated portions 151 and 161.

The insulation member 18 is made of an electrically insulating material. In the present embodiment, a resin molded article is employed as the insulation member 18. The insulation member 18 includes a base portion 180 and cylinder portions 181, 182. The base portion 180 is interposed between the laminated portions 151 and 161. The base portion 180 is also interposed between the extension portions of the laminated portions 151 and 161. The cylinder portions 181 and 182 are provided at positions overlapping with the extension portions of the laminated portions 151 and 161 in the projection view in the Y-direction. The cylinder portions 181 and 182 project upward in the Y-direction from the base portion 180.

The cylinder portion 181 is inserted through the through hole 163 of the negative busbar 16. The cylinder portion 181 is disposed in the through hole 163 in order to prevent a contact between the collector terminal C1 and the protruding portion 152, and the negative busbar 16. For that reason, the cylinder portion 181 is not disposed in the through hole 163 in which the emitter terminal E2 is disposed. The collector terminal C1 and the protruding portion 152 are inserted through the cylinder portion 181, and are surface-connected to each other above the cylindrical portion 181.

The cylinder portion 182 is inserted through the through hole 164 of the negative busbar 16. The cylinder portion 182 is disposed in each of the through holes 164 in order to prevent a contact between the negative busbar 16 and the upper and lower coupling portion 91 including the emitter terminal E12 and the collector terminal C22. The emitter terminal E12 and the collector terminal C22 are inserted through the cylinder portion 182.

The coolers 19 allow a refrigerant to flow through the coolers 19, and are disposed on both sides of each semiconductor device 20 in the Z-direction to cool the semiconductor device 20 from the both sides. The semiconductor device 20 is sandwiched between the coolers 19 in the Z-direction. The cooler 19 is interposed between the first semiconductor device 21 and the second semiconductor device 22. The heat generated by the semiconductor chips 41 and 42 is radiated from exposed surfaces of the heat sinks 51c, 51e, 52c, and 52e to the coolers 19 through an insulation member (not shown).

Next, a method of manufacturing the laminated portions 151 and 161 having the through holes 153 and 163 will be described. In this example, the laminated portion 161 of the negative busbar 16 will be described as an example.

Figure 11:
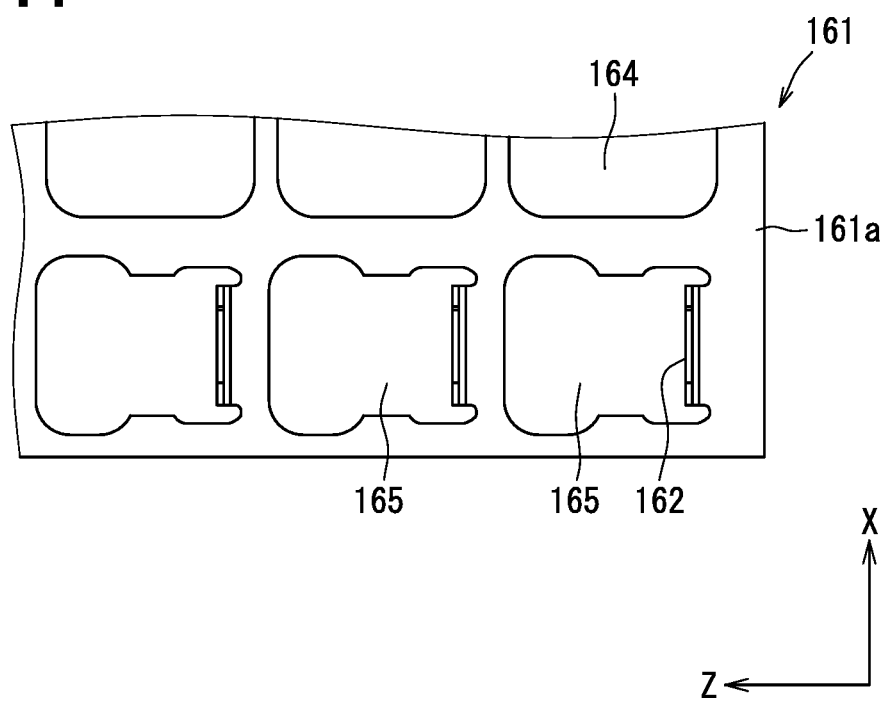
FIG. 11 is a plan view showing a method of manufacturing a laminated portion.

As shown in FIG. 11, first, a substrate 161a in which the protruding portions 162, the through holes 164, and notches 165 are provided is prepared. A metal plate is punched to form a substrate 161a with the protruding portions 162, the through holes 164, and the notches 165. At the time of punching, the protruding portions 162 are flush with the substrate 161a. The notches 165 are spaces (openings) for separating the protruding portions 162 from the substrate 161a while leaving a coupling part of the protruding portions 162 and the substrate 161a. After punching, the protruding portions 162 are bent upward in the Y-direction by approximately 90 degrees.

Figure 12:
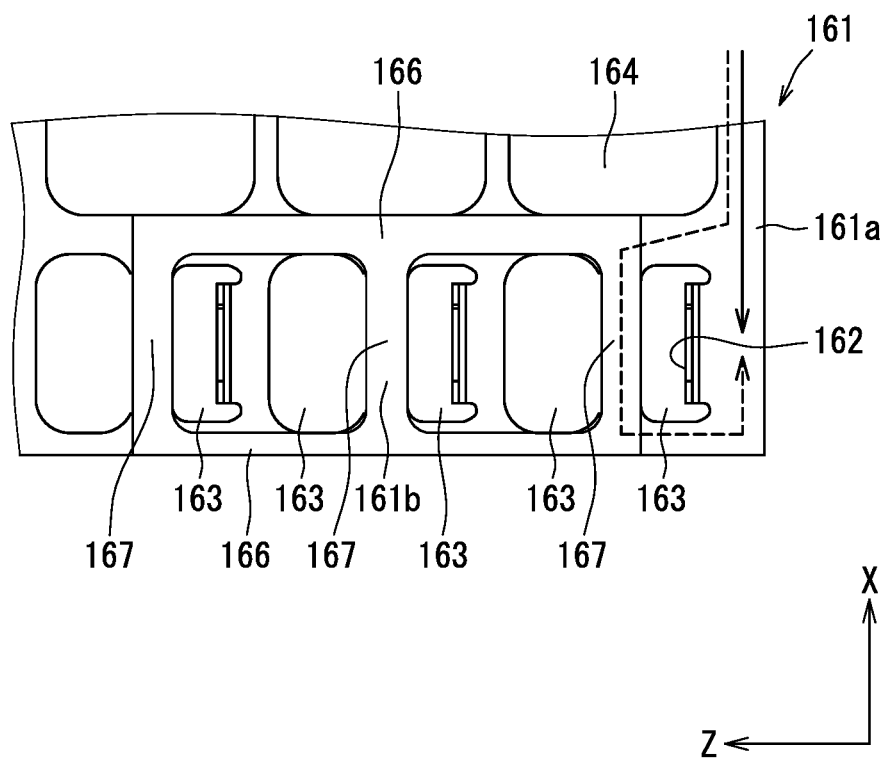
FIG. 12 is a plan view showing a method of manufacturing a laminated portion.

Next, as shown in FIG. 12, a partition plate 161b is fixed on the substrate 161a. The partition plate 161b has two first extension portions 166 and three second extension portions 167. The first extension portion 166 extends in the Z-direction, and the second extension 167 extends in the X-direction. The three second extension portions 167 are provided at predetermined intervals in the Z-direction. One of the first extension portions 166 is connected to one end of each of the second extension portions 167, and the other of the first extension portions 166 is connected to the other end of each of the second extension portions 167. The first extension portions 166 are fixed to the substrate 161a with the result that the three second extension portions 167 divides each of the three notches 165 into two in the Z-direction. The partition plate 161b partitions each notch 165 into a through hole 163 in which the protruding portion 162 is provided at the opening edge portion, and a through hole 163 in which the protruding portion 162 is not provided.

In this manner, the substrate 161a and the partition plate 161b form the laminated portion 161. In other words, the negative busbar 16 having the through holes 163 is formed. The positive busbar 15 is also formed in the same manner. In FIGS. 8 to 10, the laminated portions 151 and 161 are illustrated in a simplified manner.

A method of manufacturing the positive busbar 15 and the negative busbar 16 having the through holes 153 and 163 is not limited to the above example. For example, a partition portion corresponding to the partition plate 161b is formed integrally with the substrate 161a by punching, and the partition portion is folded back approximately 180 degrees by hemming bending. The notches 165 may be divided into two through holes 163 by connecting the partition portion folded and stacked to the substrate 161a.

Next, the effects of the above-described configuration will be described.

In the present embodiment, the power converter 5 includes the multiple first semiconductor devices 21 and the multiple second semiconductor devices 22, and the first semiconductor devices 21 and the second semiconductor devices 22 are alternately disposed in the Z-direction. As described above, since the emitter terminal E1 and the collector terminal C2 are disposed to face each other, the structure of the upper and lower coupling portions 91 formed by the bridging member 80 can be shared in the multiple semiconductor modules 90 by alternately disposing the first semiconductor devices 21 and the second semiconductor devices 22. Further, since the collector terminal C1 and the emitter terminal E2 are disposed to face each other, the connection structure with the smoothing capacitor 14, that is, the connection structure with the positive busbar 15 and the negative busbar 16 can be shared in the multiple semiconductor modules 90 by alternately disposing the first semiconductor devices 21 and the second semiconductor devices 22.

In addition, a through hole through which the collector terminal C1 and the emitter terminal E2 are inserted from the bottom to the top is provided in at least one of the positive busbar 15 and the negative busbar 16. One collector terminal C1 and one emitter terminal E2 are disposed in each through hole. In the present embodiment, as the through holes, the through hole 153 is provided in the positive busbar 15, and the through hole 163 is provided in the negative busbar 16. According to the above configuration, as illustrated in FIG. 12, not only a current path indicated by a solid line arrow but also a current path indicated by a dashed line arrow are formed, so that the inductance of the main circuit wiring can be reduced as compared with the configuration in which the main circuit wiring is not partitioned.

Second Embodiment

The present embodiment can refer to the preceding embodiment. For that reason, a description of portions common to the power converter 5, the semiconductor device 20, and the semiconductor module 90 described in the preceding embodiment will be omitted.

Figure 13:
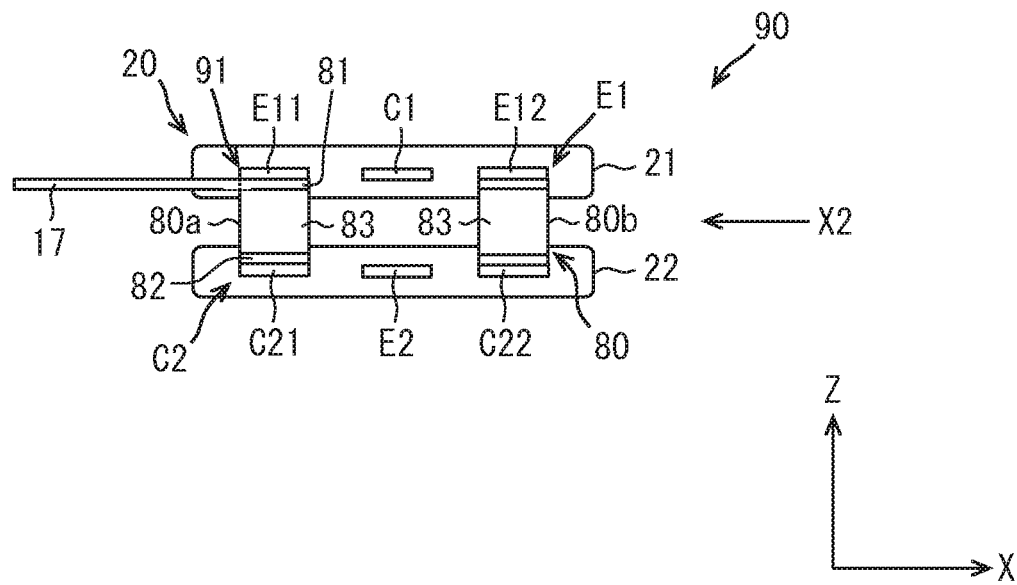
FIG. 13 is a plan view showing a semiconductor module in a power converter according to a second embodiment.
Figure 14:
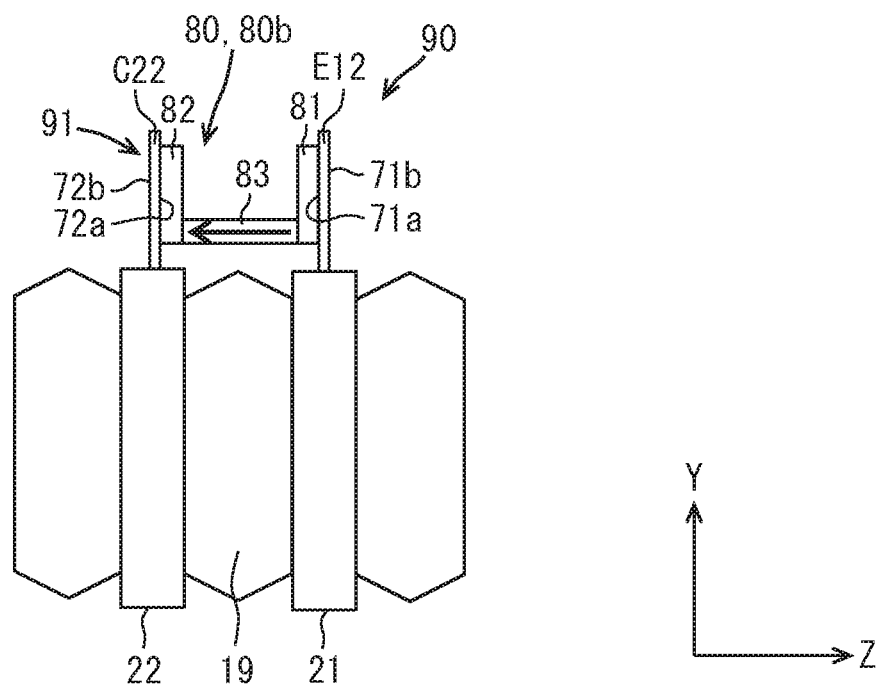
FIG. 14 is a plan view of FIG. 13 as viewed from a direction X2.

As shown in FIGS. 13 and 14, in the present embodiment, a connection structure between a bridging member 80 and a semiconductor device 20 is different from that of the preceding embodiment. FIG. 14 is a plan view of a stacked structure of a semiconductor module 90 and coolers 19 as viewed from a direction X2 shown in FIG. 13.

Connection portions 81 and 82 of the bridging member 80 extend in the Y-direction, which is a protruding direction of an emitter terminal E1 and a collector terminal C2, and are surface-connected to the corresponding emitter terminal E1 and the collector terminal C2. The connecting portion 83 connects the lower ends which are end portions of the connection portions 81 and 82 on the cooler 19 side to each other. The plate thickness direction of the connecting portion 83 is the Y-direction, and the connecting portion 83 faces the cooler 19. A bridging member 80a is integrally provided with an output busbar 17. The output busbar 17 is connected to an end surface 84 of the connection portion 81.

When a current indicated by a solid arrow in FIG. 14, for example, flows through the connecting portion 83 of the bridging member 80, an eddy current (not shown) is generated on a metal surface of the cooler 19 facing the connecting portion 83 in a direction that prevents a magnetic field generated by the current. Therefore, the inductance of the main circuit wiring can be reduced by the effect of the magnetic flux cancellation by the eddy current.

In particular, since the connecting portion 83 is continued to the lower ends of the connection portions 81 and 82, the connecting portion 83 is a portion closest to the cooler 19 in the bridging member 80. As a result, the effect of magnetic flux cancellation can be enhanced, and the inductance of the main circuit wiring can be effectively reduced.

Although an example in which the connecting portion 83 is flat and the plate thickness direction of the connecting portion 83 is the Y-direction has been described, the present disclosure is not limited to the above example. For example, the connecting portion 83 having a curved surface shape or a V-shaped shape in a YZ plane can be employed.

Third Embodiment

The present embodiment can refer to the preceding embodiment. For that reason, a description of portions common to the power converter 5, the semiconductor device 20, and the semiconductor module 90 described in the preceding embodiment will be omitted.

Figure 15:
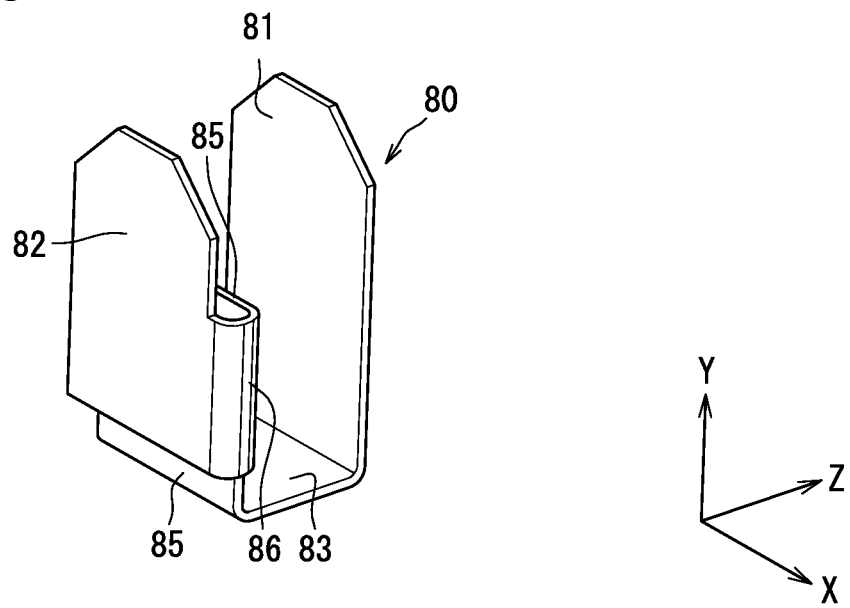
FIG. 15 is a perspective view showing a bridging member in a power converter according to a third embodiment.
Figure 16:
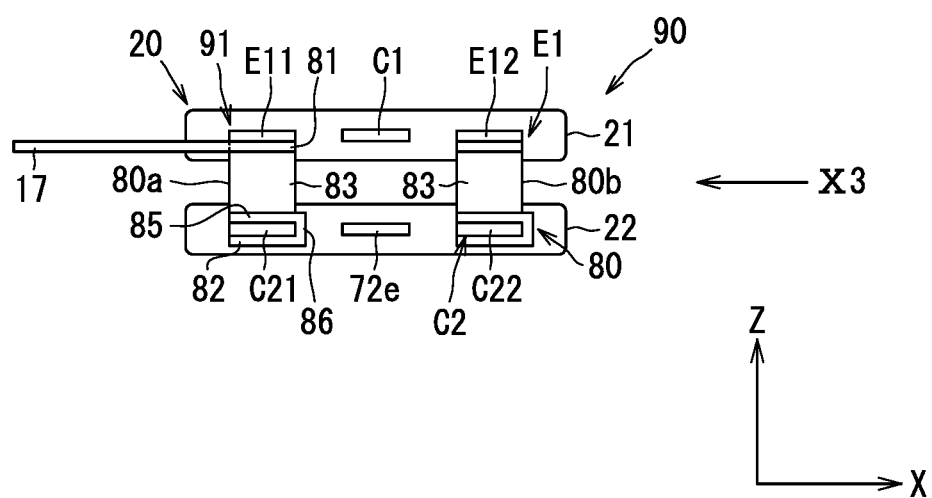
FIG. 16 is a plan view showing a semiconductor module.
Figure 17:
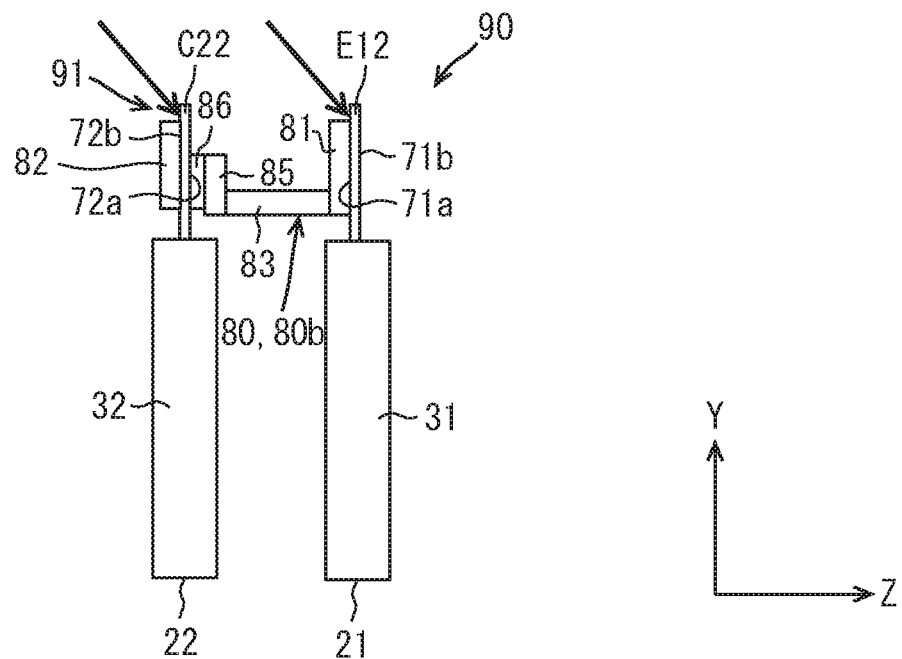
FIG. 17 is a plan view of FIG. 16 as viewed from a direction X3.

As shown in FIGS. 15 to 17, in the present embodiment, a structure of a bridging member 80 and a connection structure with a semiconductor device 20 are different from those of the preceding embodiment. In addition to connection portions 81, 82 and a connecting portion 83, the bridging member 80 has a facing portion 85 and a bent portion 86. The bridging member 80 is formed by processing a single metal plate.

As in the second embodiment, the connection portions 81 and 82 extend in the Y-direction, and the connecting portion 83 extends in the Z-direction. The connection portion 81 is surface-connected to an inner surface 71a of a corresponding emitter terminal E1, and the connection portion 82 is surface-connected to an outer surface 72b of a collector terminal C2. One end of the connecting portion 83 is connected to a lower end of the connection portion 81, and the other end is connected to a lower end of the facing portion 85.

The facing portion 85 is disposed so as to face an inner surface 72a of the collector terminal C2. The facing portion 85 is extended in the Y-direction with the plate thickness direction as the Z-direction. The collector terminal C2 is disposed between the facing portion 85 and the connection portion 82. The facing portion 85 has a predetermined gap between the facing portion 85 and the collector terminal C2.

The bent portion 86 is a portion connecting the connection portion 82 and the facing portion 85. The bent portion 86 is turned back approximately 180 degrees, and the connection portion 82 and the facing portion 85 face each other through the collector terminal C2.

As shown in FIG. 16, similarly to the preceding embodiment, an output busbar 17 is integrated with a bridging member 80a. The output busbar 17 is not connected to the bridging member 80b. The output busbar 17 is drawn out from an end surface 84 of the connection portion 81.

The bridging member 80 is connected to the emitter terminal E1 and the collector terminal C2 by laser welding. In the present embodiment, since the bridging member 80 having the configuration described above is employed, a direction of welding of the connection portion 81 to the emitter terminal E12 (E1) and a direction of welding of the connection portion 82 to the collector terminal C22 (C2) can be identical with each other as indicated by solid line arrows in FIG. 17. Therefore, the manufacturing process can be simplified. Further, as described above, when the bridging member 80 is formed of a single metal plate, the configuration of the bridging member 80 can be simplified while the manufacturing process of the semiconductor module 90 can be simplified. The direction of welding is a direction in which a laser beam is irradiated.

Fourth Embodiment

The present embodiment can refer to the preceding embodiment. For that reason, a description of portions common to the power converter 5, the semiconductor device 20, and the semiconductor module 90 described in the preceding embodiment will be omitted.

Figure 18:
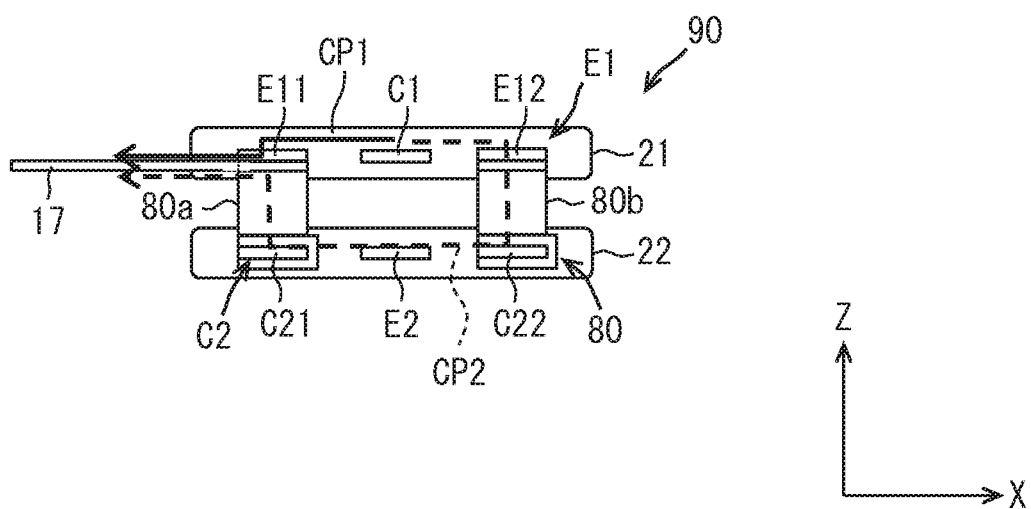
FIG. 18 is a plan view showing a current path in a steady state.
Figure 19:
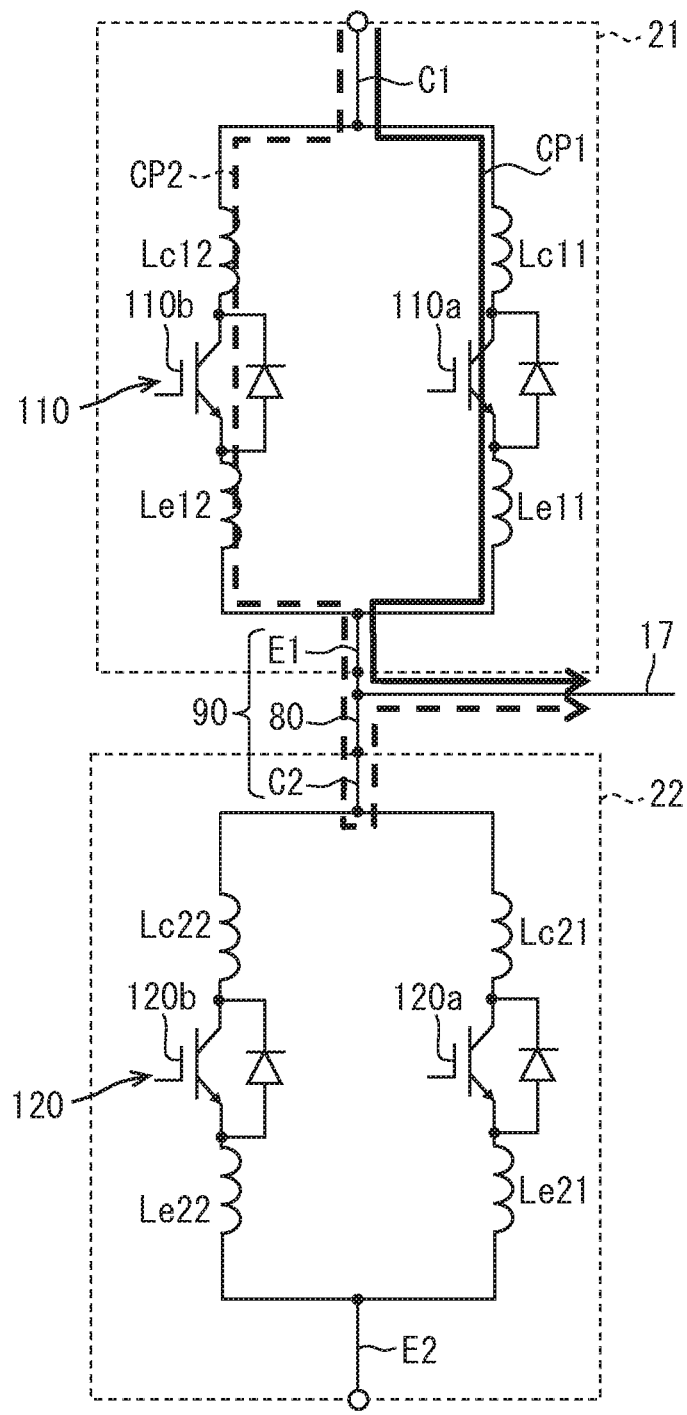
FIG. 19 is an equivalent circuit diagram showing a current path in a steady state.

When the bridging member 80 shown in the preceding embodiment is used, a current path CP2 indicated by a dashed line arrow, for example, is formed separately from a current path CP1 indicated by a solid line arrow in FIG. 18 and FIG. 19 at a stead state in which the IGBT 110 is in an on state. The current path CP1 extends in the order of the collector terminal C1, the heat sink 51c, the semiconductor chip 41a (IGBT 110a), the heat sink 51e, the emitter terminal E11, the bridging member 80a, and the output busbar 17.

On the other hand, the current path indicated by the dashed line arrow extends in the order of the collector terminal C1, the heat sink 51c, the semiconductor chip 41b (IGBT 110b), the heat sink 51e, the emitter terminal E12, the bridging member 80b, the collector terminal C22, the heat sink 52c, the collector terminal C21, the bridging member 80a, and the output busbar 17. As described above, since resistance components of the main circuit wirings differ between the current paths CP1 and CP2, there is a fear that a current imbalance may occur at the steady state.

Figure 20:
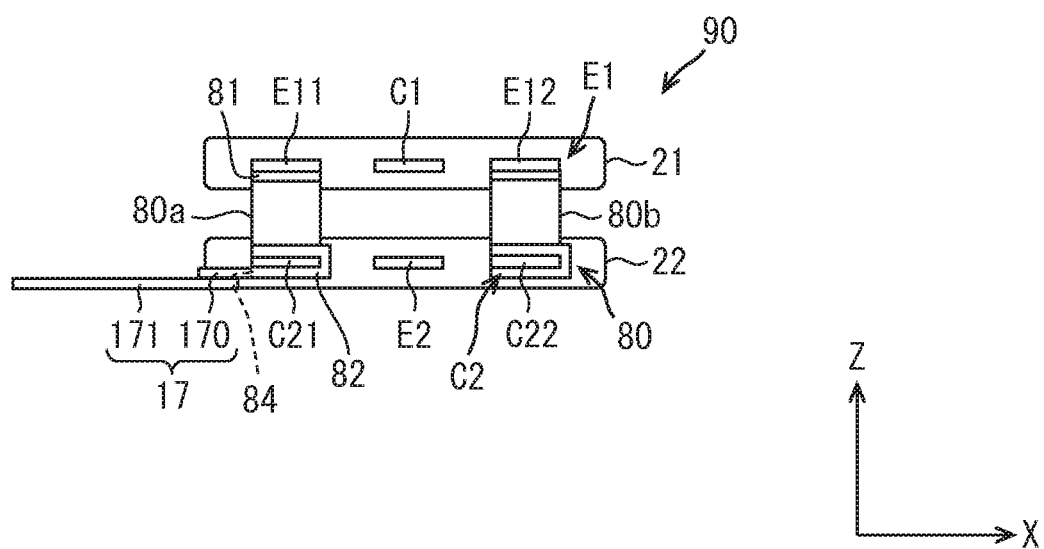
FIG. 20 is a plan view showing a semiconductor module in a power converter according to a fourth embodiment.

On the other hand, in the present embodiment, as shown in FIG. 20, in the bridging member 80a, the output busbar 17 is drawn out from the connection portion 82 connected to the collector terminal C21. The output busbar 17 includes is an extension portion 170 provided integrally with the bridging member 80a, and a conductor plate 171 which is another member different from the bridging member 80a and connected to the extension portion 170. The extension portion 170 is drawn out from the end surface 84 of the connection portion 82 in the X-direction. Except for the output busbar 17, the bridging member 80a has the same structure as that of the bridging member 80a shown in the third embodiment.

Figure 21:
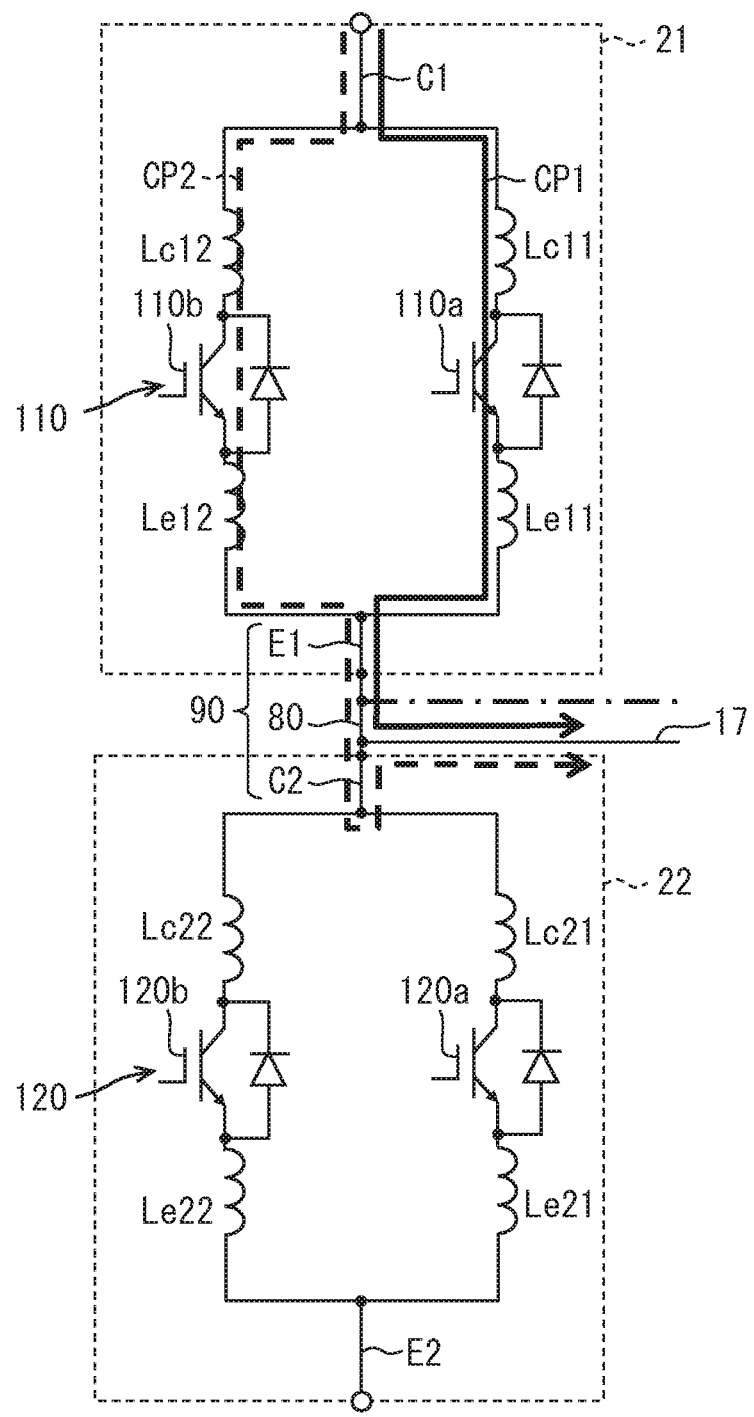
FIG. 21 is an equivalent circuit diagram showing a current path in a steady state.

As described above, since the output busbar 17 is pulled out from the connection portion 82, a connection point between the bridging member 80a (80) and the output busbar 17 is deviated to the second semiconductor device 22 side as shown in FIG. 21. A one-dot chain line shown in FIG. 21 indicates the output busbar 17 in FIG. 19. As described above, a resistance of the current path CP1 can be increased and a resistance of the current path CP2 can be reduced as compared with the configuration shown in FIGS. 18 and 19 by the deviation of the connection point. As a result, the current imbalance at the steady state can be inhibited.

Although an example in which the output busbar 17 is pulled out from the connection portion 82 has been described, the present disclosure is not limited to the above example. The bridging member 80 may be pulled out from a position closer to the second semiconductor device 22 than an intermediate point in the extension direction. Also, the structure of the bridging member 80 is not limited to the above example.

Fifth Embodiment

The present embodiment can refer to the preceding embodiment. For that reason, a description of portions common to the power converter 5, the semiconductor device 20, and the semiconductor module 90 described in the preceding embodiment will be omitted.

Figure 22:
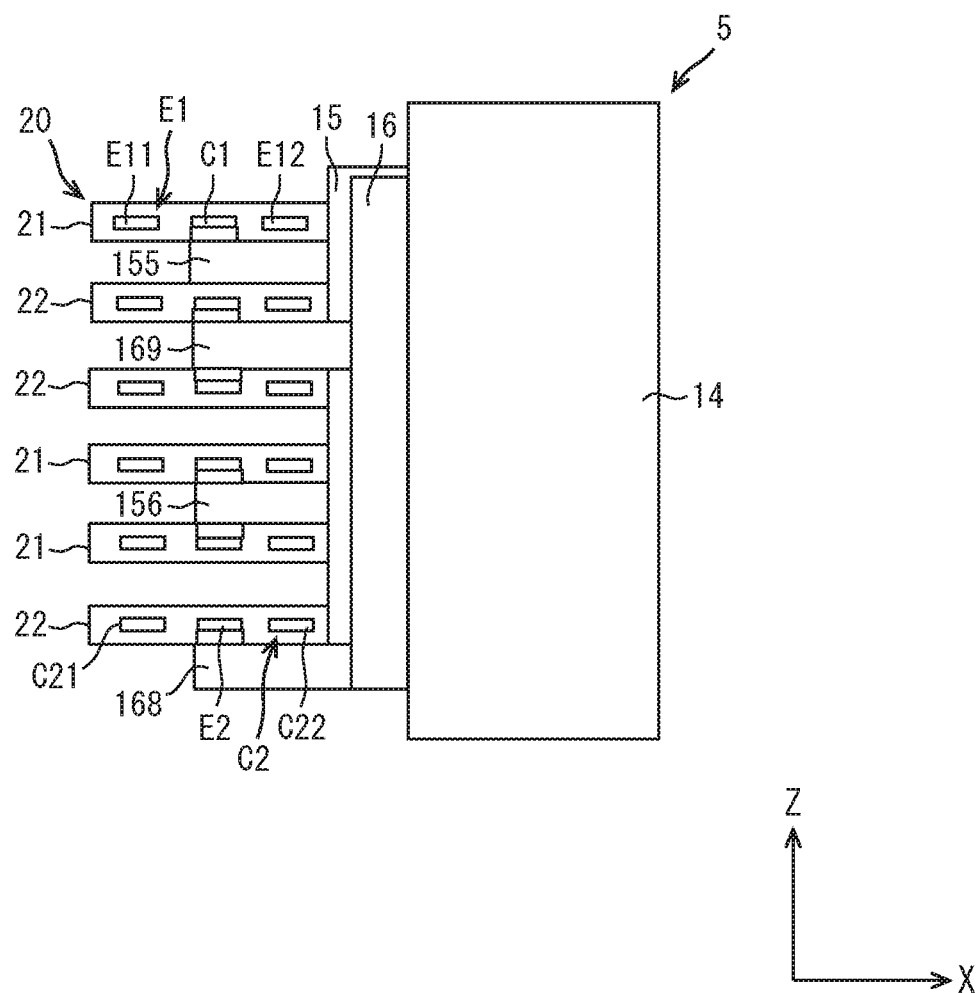
FIG. 22 is a plan view showing a power converter according to a fifth embodiment.

In the present embodiment, as shown in FIG. 22, the power converter 5 has at least one of a portion where the two first semiconductor devices 21 are continuous and a portion where the two second semiconductor devices 22 are continuous in the Z-direction, which is the stacking direction. In FIG. 22, an output busbar 17, coolers 19, and a bridging member 80 will be omitted for convenience.

Specifically, six semiconductor devices 20 are stacked in the Z-direction in the order of a first semiconductor device 21, a second semiconductor device 22, the second semiconductor device 22, the first semiconductor device 21, the first semiconductor device 21, and the second semiconductor device 22. In other words, the semiconductor devices 20 have one portion in which the two first semiconductor devices 21 are continuous and one portion in which the two second semiconductor devices 22 are continuous.

In the portion where the first semiconductor devices 21 are continuous, collector terminals C1 are adjacent to each other in the Z-direction. In the portion where the second semiconductor devices 22 are continuous, the emitter terminals E2 are adjacent to each other in the Z-direction. Therefore, as shown in FIG. 22, the two adjacent collector terminals C1 can be connected together to a positive busbar 15. In addition, the two adjacent emitter terminals E2 can be connected together to a negative busbar 16. Therefore, the connection between the positive busbar 15 and the negative busbar 16 and the semiconductor device 20 can be simplified.

In FIG. 22, reference numerals 155 and 156 denote terminal portions of the positive busbar 15, and reference numerals 168 and 169 denote terminal portions of the negative busbar 16. The terminal portion 156 is a terminal portion shared by the two collector terminals C1. The terminal portion 169 is a terminal portion shared by the two emitter terminals E2.

Hereinafter, the signal terminals are omitted for convenience of illustration.

The power converter 5 may include at least one first semiconductor device 21, one second semiconductor device 22, and a bridging member 80 that connects the first semiconductor device 21 and the second semiconductor device 22. In other words, at least one semiconductor module 90 may be provided. The power converter 5 may include at least one of the smoothing capacitor 14 including the positive busbar 15 and the negative busbar 16, the output busbar 17, and the cooler 19 together with the semiconductor module 90.

Although an example in which the upper and lower arm circuits 10, that is, the semiconductor module 90, is applied to the inverter 13 has been described, the present disclosure is not limited to the above example. For example, the semiconductor module 90 can be applied to a boost converter. The present disclosure can also be applied to both the inverter 13 and the boost converter.

The number of semiconductor modules 90 is not limited to the above example. For example, six semiconductor modules 90 may be provided so as to correspond to two motors of the three-phase AC type.

Although the diodes 111 and 121 for reflux are integrally formed with the IGBTs 110 and 120, the present disclosure is not limited to the above example. The diodes 111 and 121 may be separate chips.

Although the examples of the IGBTs 110 and 120 are shown as the switching elements, the present disclosure is not limited to the above example. The switching element may be configured by a switching element having a gate electrode, and a first main electrode and a second main electrode through which a main current flows. For example, a MOSFET may be employed.

Although the first semiconductor device 21 has one collector terminal C1 and two emitter terminals E1, and the second semiconductor device 22 has two collector terminals C2 and one emitter terminal E2, the present disclosure is not limited to the above example. The first semiconductor device 21 may have two collector terminals C1 and one emitter terminal E1, and the second semiconductor device 22 may have one collector terminal C2 and two emitter terminals E2. In this case, the upper and lower coupling portions 91 are provided in one position.

Figure 23:
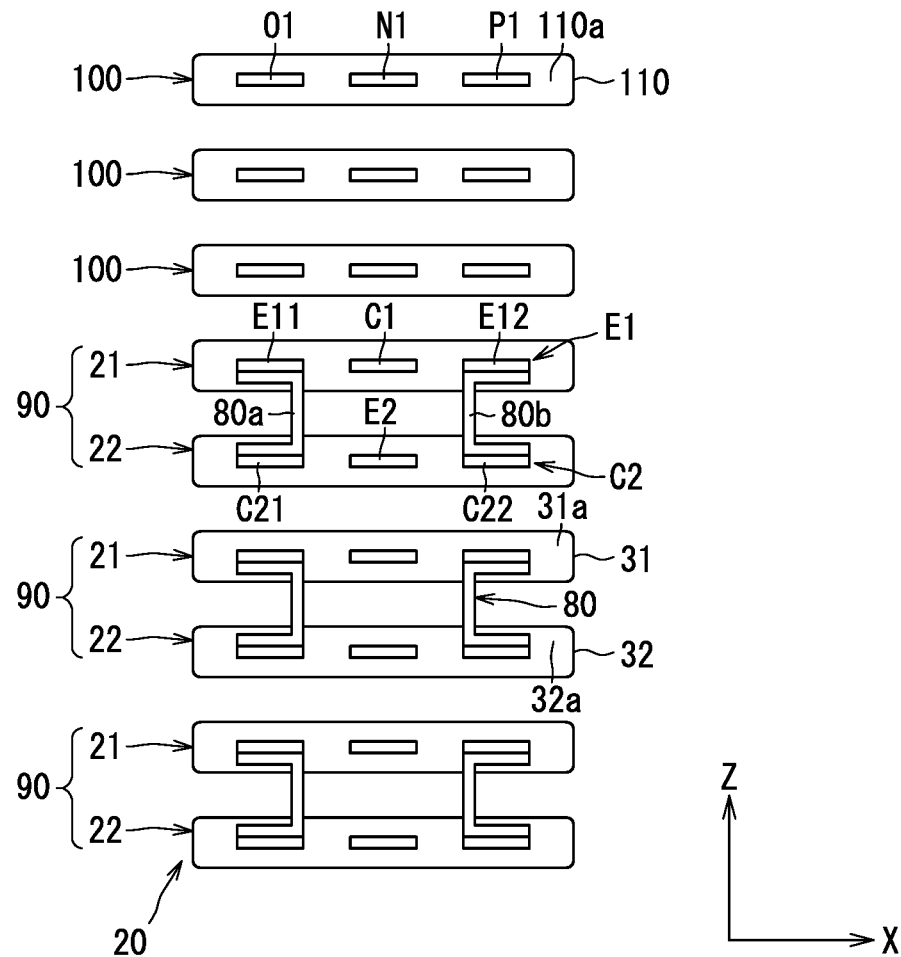
FIG. 23 is a plan view showing a first modification.

As shown in a first modification of FIG. 23, a semiconductor device 100 may be provided in addition to the semiconductor device 20 described above. The semiconductor device 100 includes a semiconductor chip (not shown) configuring an upper arm circuit and a semiconductor chip (not shown) configuring a lower arm circuit in the sealing resin body 110. The semiconductor device 100 has a so-called 2-in-1 package structure configuring an upper and lower arm circuit for one phase. In FIG. 23, six semiconductor devices 20 configuring a three-phase inverter and three semiconductor devices 100 configuring another three-phase inverter are stacked on each other in the Z-direction. The semiconductor devices 100 are disposed in succession.

The semiconductor device 100 includes, as main terminals, a positive electrode terminal P1 connected to the positive electrode of the smoothing capacitor 14, a negative electrode terminal N1 connected to the negative electrode, and an output terminal O1 connected to a load. Those main terminals project from the side surfaces 110a of the sealing resin body 110 and extend in the Y-direction. The sealing resin bodies 31 and 32 have the same structure as that of the sealing resin body 110, and have substantially the same outer shape. In other words, in a projection view from the Z-direction, the outer shapes of the sealing resin bodies 31, 32, and 110 substantially coincide with each other. In addition, the thicknesses in the Z-direction also substantially coincide with each other. Further, the main terminals are disposed in the same manner. The collector terminals C1 and the emitter terminals E2 are aligned in a line along the Z-direction together with the negative electrode terminals N1. The emitter terminals E11 and the collector terminals C21 are aligned in a line together with the output terminals O1, and the emitter terminals E12 and the collector terminals C22 are aligned in a line together with the positive electrode terminals P1.

This makes it possible to simplify the connection structure between the smoothing capacitor 14 and a load (motor) when the semiconductor device 100 having a 2 in 1 structure is used in combination.

Figure 24:
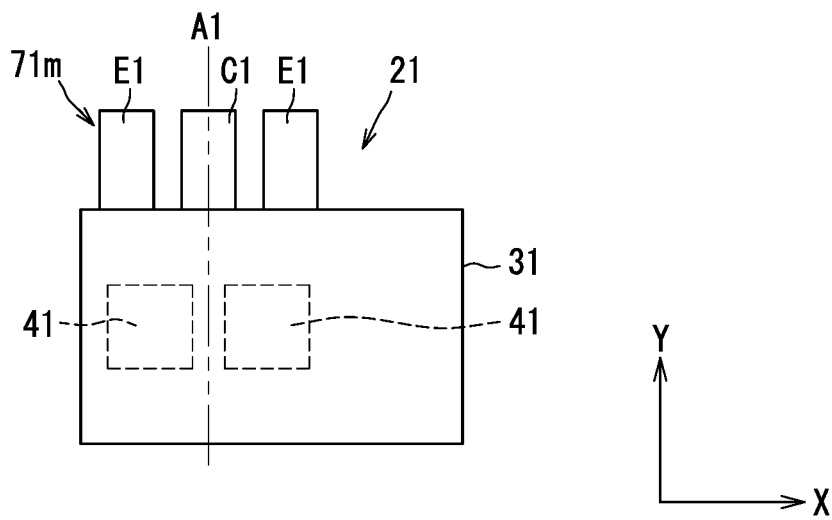
FIG. 24 is a plan view showing a second modification.

Although an example is shown in which the first axis A1 substantially coincides with the center of the outer shape of the sealing resin body 31 in the X-direction, the present disclosure is not limited to the above example. As shown in a second modification of FIG. 24, a configuration can be employed in which the first axis A1 is biased to one side with respect to the center of the outer shape of the sealing resin body 31 in the X-direction, and the collector terminal C1 and the emitter terminal E1, which are the main terminals 71m, are arranged line-symmetrically with the first axis A1 as the symmetry axis. The same applies to the second axis A2.

Figure 25:
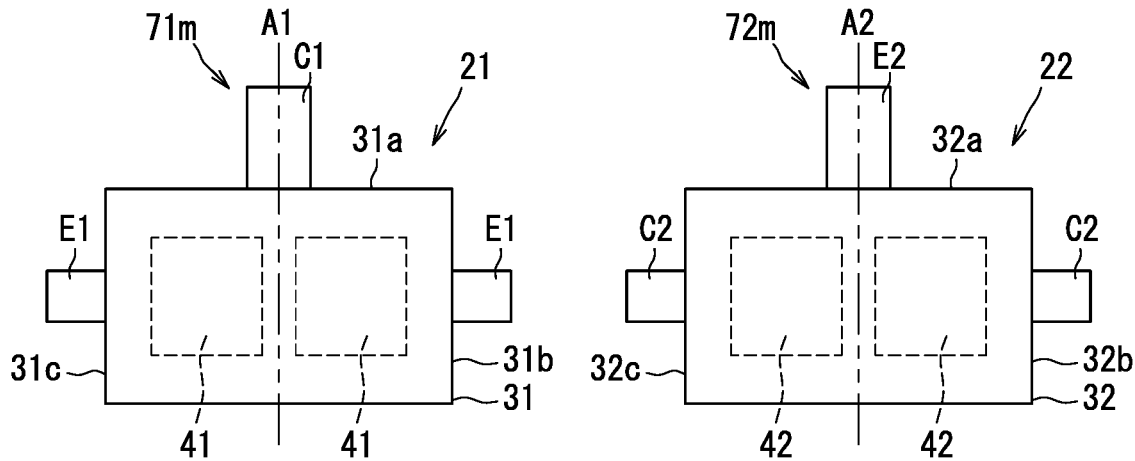
FIG. 25 is a plan view showing a third modification.

Although an example in which all of the main terminals 71m protrude from the side surface 31a of the sealing resin body 31 and all of the main terminals 72m protrude from the side surface 32a of the sealing resin body 32 has been shown, the present disclosure is not limited to the above example. As shown in a third modification of FIG. 25, the main terminals 71m may protrude from three different side surfaces 31a, 31b, and 31c of the sealing resin body 31, and the main terminals 72m may protrude from three different side surfaces 32a, 32b, and 32c of the sealing resin body 32.

For example, in the first semiconductor device 21, the collector terminal C1 protruding from the side surface 31a is disposed on the first axis A1, and the emitter terminal E1 protrudes from the side surfaces 31b and 31c adjacent to each other. Each of the collector terminal C1 and the emitter terminal E1 is arranged in line symmetry with the first axis A1 as the symmetry axis, and each of the collector terminal C2 and the emitter terminal E2 is arranged in line symmetry with the second axis A2 as the symmetry axis.

Figure 26:
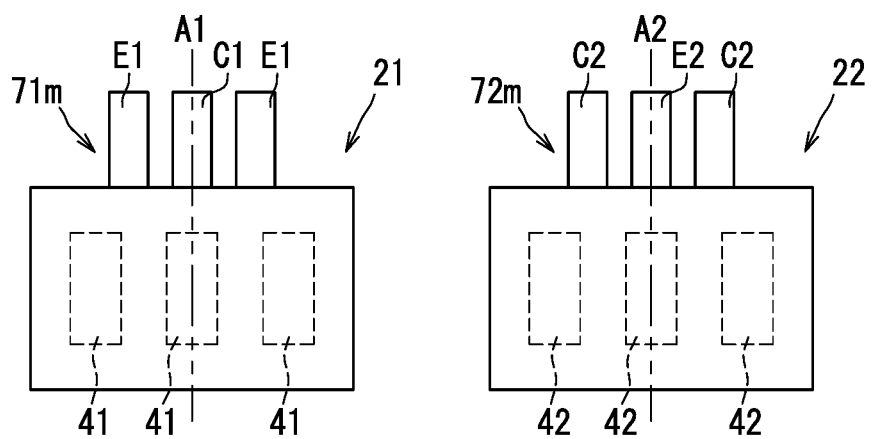
FIG. 26 is a plan view showing a fourth modification.

In the semiconductor device 20, a parallel circuit of the IGBTs 110 is formed by the two semiconductor chips 41 and a parallel circuit of the IGBTs 120 is formed by the two semiconductor chips 42, but the present disclosure is not limited to the above example. A parallel circuit may be formed with the use of three or more semiconductor chips. In a fourth modification shown in FIG. 26 and a fifth modification shown in FIG. 27, the first semiconductor device 21 has three semiconductor chips 41, and the three semiconductor chips 41 are aligned side by side in the X-direction. The second semiconductor device 22 has three semiconductor chips 42, and the three semiconductor chips 42 are aligned side by side in the X-direction. In FIG. 26, the main terminals 71m protrude from the same surface, and the main terminals 72m also protrudes from the same surface. In FIG. 27, the main terminals 71m protrude from the multiple different surfaces, and the main terminals 72m also protrude from the multiple different surfaces. Each of the collector terminal C1 and the emitter terminal E1 is arranged in line symmetry with the first axis A1 as the symmetry axis, and each of the collector terminal C2 and the emitter terminal E2 is arranged in line symmetry with the second axis A2 as the symmetry axis.

Although an example in which three main terminals 71m and three main terminals 72m are provided is shown, the present disclosure is not limited to the above example. Three or more of each of the main terminals 71m and 72m are provided, and the placement of the collector terminal C2 with respect to the emitter terminal E2 may be different from the placement of the emitter terminal E1 with respect to the collector terminal C1 while satisfying the above-mentioned line symmetry relationship.

For example, in a sixth modification shown in FIG. 28, the main terminal 71m has two collector terminals C1 and two emitter terminals E1, and the main terminal 72m has two collector terminals C2 and two emitter terminals E2. The two collector terminals C1 are arranged in line symmetry with the first axis A1 as the symmetry axis. The two emitter terminals E1 are arranged in line symmetry with the first axis A1 as the symmetry axis. In the same manner, the two collector terminals C2 are arranged in line symmetry with the second axis A2 as the symmetry axis. The two emitter terminals E2 are arranged in line symmetry with the second axis A2 as the symmetry axis. Further, two collector terminals C1 are disposed between the emitter terminals E1. Two emitter terminals E2 are disposed between the collector terminals C2.

Although an example is shown in which all the semiconductor chips 41 included in the first semiconductor device 21 are aligned in a line along the X-direction, the present disclosure is not limited to the above example. For example, in a seventh modification shown in FIG. 29, the first semiconductor device 21 has four semiconductor chips 41. The four semiconductor chips 41 are aligned in two rows and two columns in an XY-plane. The two semiconductor chips 41 are aligned side by side in the X-direction, and the first axis A1 is set so as to be orthogonal to the alignment direction. Each of the collector terminal C1 and the emitter terminal E1 is arranged in line symmetry with the first axis A1 as the symmetry axis. The same applies to the second semiconductor device 22.

Figure 29:
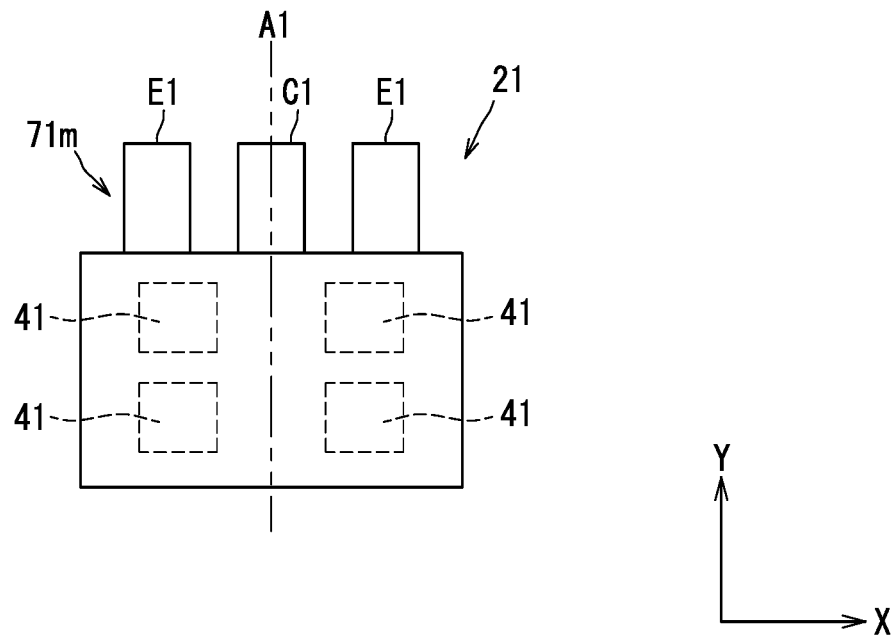
FIG. 29 is a plan view showing a seventh modification.
Figure 30:
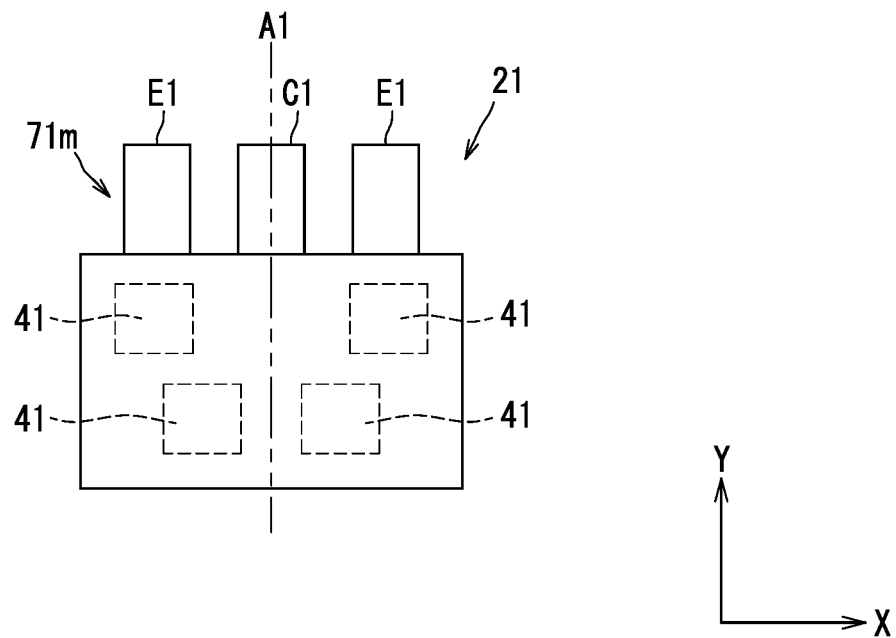
FIG. 30 is a plan view showing an eighth modification.

In an eighth modification shown in FIG. 30, a distance between the two semiconductor chips 41 on the main terminal 71m side is longer than a distance between the two semiconductor chips 41 on the main terminal 71m side as compared with FIG. 29. In FIG. 30, two semiconductor chips 41 are aligned side by side in the X-direction, and the first axis A1 is set so as to be orthogonal to the alignment direction. The same applies to the second semiconductor device 22.

Figure 31:
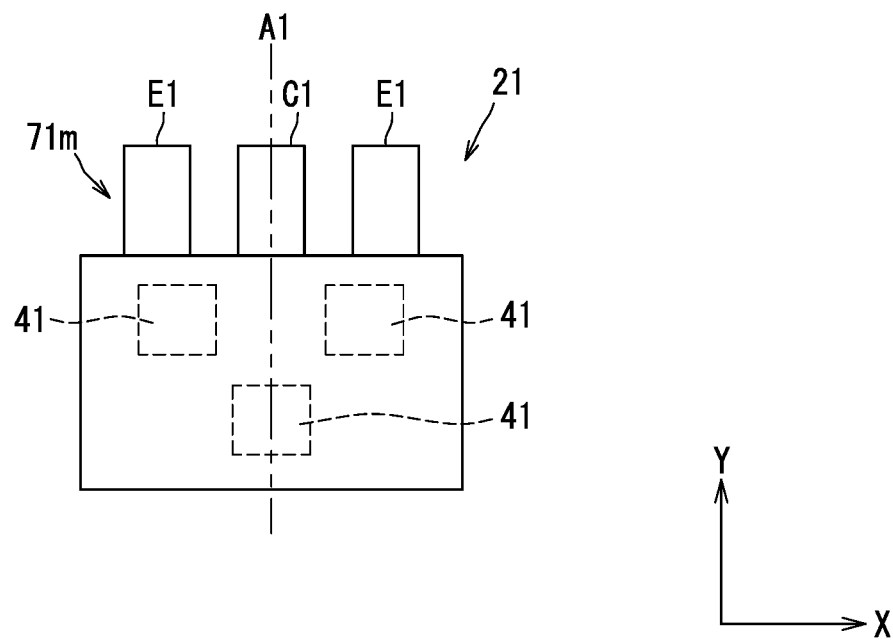
FIG. 31 is a plan view showing a ninth modification.

In a ninth modification shown in FIG. 31, the first semiconductor device 21 has three semiconductor chips 41. Two semiconductor chips 41 are disposed on the main terminal 71m side, and one semiconductor chip 41 is disposed at a position away from the main terminal 71. The two semiconductor chips 41 disposed on the main terminal 71m side are aligned side by side in the X-direction, and the first axis A1 is set so as to be orthogonal to the alignment direction. The same applies to the alignment direction of the semiconductor chips 42 included in the second semiconductor device 22. Alternatively, one semiconductor chip 41 may be disposed on the main terminal 71m side, and two semiconductor chips 41 may be disposed at positions apart from the main terminal 71.

Although an example in which the terminals 61, 62 are provided as the semiconductor device 20 having a double-sided heat dissipation structure has been described, the present disclosure is not limited to the above example. The terminals 61 and 62 may not be provided. An example in which the heat sink 51c, 51e, 52c, and 52e are exposed from the respective sealing resin bodies 31 and 32 is shown, but the heat sinks 51c, 51e, 52c, and 52e may not to be exposed from the sealing resin bodies 31 and 32. The heat sinks 51c, 51e, 52c, and 52e may be divided into multiple pieces according to the number of the semiconductor chips 41 and 42, for example. However, an integrated circuit can more inhibit voltage fluctuation in the parallel circuit.

Although an example in which the semiconductor device 20 includes the sealing resin bodies 31 and 32 has been described, the present disclosure is not limited to the above example. The sealing resin bodies 31 and 32 may not be provided.

Figure 32:
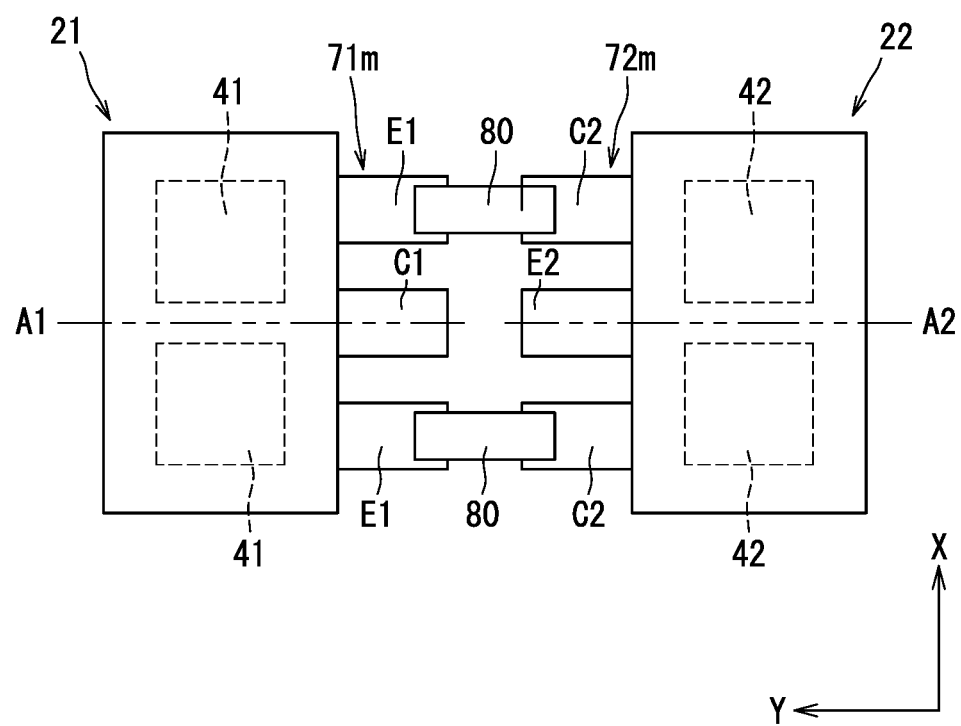
FIG. 32 is a plan view showing a tenth modification.

The structure of the semiconductor device 20 is not limited to a double-sided heat dissipation structure. The present disclosure is also applicable to a single-sided heat dissipation structure. The present disclosure is not limited to a switching element having a vertical structure, and can be applied to a switching element having a horizontal structure (for example, a LDMOS). The multiple semiconductor devices 20 are not limited to the stacked layout, and may be connected in a flat state. In a tenth modification shown in FIG. 32, a single-sided heat dissipation structure is employed as the first semiconductor device 21 and the second semiconductor device 22, and the emitter terminal E1 and the collector terminal C2 are connected to each other by the bridging member 80 in a flat state. Each of the collector terminal C1 and the emitter terminal E1 is arranged in line symmetry with the first axis A1 as the symmetry axis, and each of the collector terminal C2 and the emitter terminal E2 is arranged in line symmetry with the second axis A2 as the symmetry axis.

Figure 33:
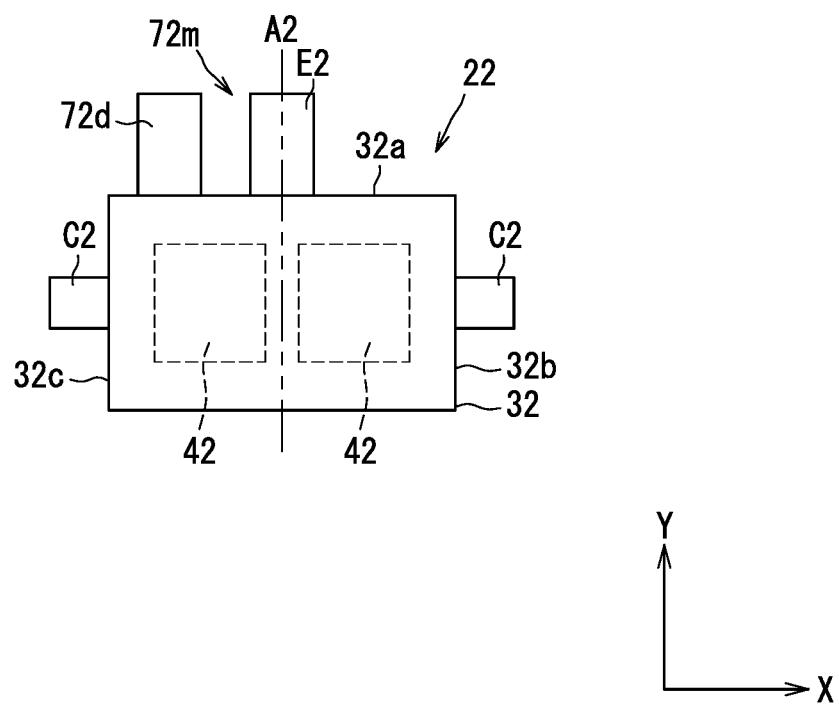
FIG. 33 is a plan view showing an eleventh modification.

In addition to the main terminal, the semiconductor device 20 may have a dummy terminal to which an electrical connection function is not applied. In an eleventh modification shown in FIG. 33, the second semiconductor device 22 has a dummy terminal 72d separately from the main terminal 72m. The dummy terminal 72d is not included in the main terminal 72m. The collector terminal C2 and the emitter terminal E2 are arranged line-symmetrically with the second axis A2 as the symmetry axis. The same applies to the first semiconductor device 21.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A power converter comprising:
   an upper arm and a lower arm connected in series;
   the upper arm including at least one first semiconductor device that includes a plurality of first semiconductor chips, each of the plurality of first semiconductor chips has a first switching element, and a plurality of first main terminals which are connected to the plurality of first semiconductor chips and provide an electric connection function, the first switching elements being connected in parallel and the plurality of first main terminals including at least one first high potential terminal connected to an electrode of the first switching element on a high potential side and at least one first low potential terminal connected to an electrode of the first switching element on a low potential side;
   the lower arm including at least one second semiconductor device that includes a plurality of second semiconductor chips, each of the plurality of second conductor chips has a second switching element, and a plurality of second main terminals which are connected to the plurality of second semiconductor chips and provide an electric connection function, the second switching elements being connected in parallel, and the plurality of second main terminals including at least one second high potential terminal connected to an electrode of the second switching element on the high potential side and at least one second low potential terminal connected to an electrode of the second switching element on the low potential side; and
   a bridging member that bridges the at least one first low potential terminal and the at least one second high potential terminal, and provides an upper and lower coupling portion between the upper arm and the lower arm with the at least one first low potential terminal and the at least one second high potential terminal, wherein:
   in the at least one first semiconductor device,
   the plurality of first semiconductor chips are in line symmetry with respect to a first axis perpendicular to a first direction in which at least two of the plurality of first semiconductor chips are aligned, and
   the at least one first high potential terminal and the at least one first low potential terminal are each in line symmetry with respect to the first axis as a symmetry axis; and
   in the at least one second semiconductor device,
   the plurality of second semiconductor chips are in line symmetry with respect to a second axis perpendicular to a second direction in which at least two of the plurality of second semiconductor chips are aligned, the at least one second high potential terminal and the at least one second low potential terminal are each in line symmetry with respect to the second axis as the symmetry axis, and
an arrangement of the at least one second low potential terminal relative to the at least one second high potential terminal is different from an arrangement of the at least one first low potential terminal relative to the at least one first high potential terminal.

2. The power converter according to claim 1, wherein:
there is an equal number of the first high potential terminals and the second low potential terminals; and
there is an equal number of the first low potential terminals and the second high potential terminals.

3. The power converter according to claim 1, wherein:
a plurality of bridging members, the first low potential terminals and the second high potential terminals comprise a plurality of upper and lower coupling portions.

4. The power converter according to claim 3, further comprising:
a wiring portion configured to connect to a load, wherein:
the wiring portion is drawn out from only a part of the plurality of the upper and lower coupling portions.

5. The power converter according to claim 4, wherein:
the wiring portion is not drawn out from each surface of the bridging member in a plate thickness direction, but is drawn out from an edge connecting two surfaces.

6. The power converter according to claim 5, wherein:
the wiring portion is drawn out from a place of the bridging member on a second high potential terminal side.

7. The power converter according to claim 3, wherein:
the plurality of the upper and lower coupling portions are provided by the bridging members having a same structure.

8. The power converter according to claim 1, wherein:
the first semiconductor device further includes a first sealing resin body that seals the plurality of first semiconductor chips;
the second semiconductor device further includes a second sealing resin body that seals the plurality of second semiconductor chips;
the plurality of first main terminals protrude from the first sealing resin body to an outside;
the plurality of second main terminals protrude from the second sealing resin body to an outside;
the bridging member connects a protruding portion of the at least one first low potential terminal and a protruding portion of the at least one second high potential terminal;
the plurality of first main terminals protrude from a same surface of the first sealing resin body and are aligned along the first direction; and
the plurality of second main terminals protrude from a same surface of the second sealing resin body and are aligned along the second direction.

9. The power converter according to claim 8, wherein:
the first main terminals include three first main terminals,
the at least one first high potential terminal is between two of the at least on first low potential terminal;
the second main terminals includes three second main terminals; and
the at least one second low potential terminal is between two of the at least one second high potential terminal.

10. The power converter according to claim 1, wherein:
the first semiconductor device and the second semiconductor device are stacked such that the first semiconductor device and the second semiconductor device connected by the bridging member are adjacent; and
at least one of a pair of the at least one first high potential terminal and the at least one second low potential terminal and a pair of the at least one first low potential terminal and the at least one second high potential terminal face each other at least partially in a stacking direction.

11. The power converter according to claim 10, wherein:
the at least one first semiconductor device includes a plurality of first semiconductor devices;
the at least one second semiconductor device includes a plurality of second semiconductor devices; and
the plurality of the first semiconductor devices and the plurality of the second semiconductor devices are alternately arranged.

12. The power converter according to claim 11, further comprising:
a smoothing capacitor that is configured to smooth a power supply voltage;
a positive busbar that connects a positive electrode of the smoothing capacitor and the first high potential terminal; and
a negative busbar that connects a negative electrode of the smoothing capacitor and the second low potential terminal, wherein:
at least one of the positive busbar and the negative busbar has a plurality of through holes aligned side by side in the stacking direction; and
the at least one first high potential terminal and the at least one second low potential terminal are individually in the through holes.

13. The power converter according to claim 10, wherein:
the at least one first semiconductor device includes a plurality of first semiconductor devices; and
the at least one second semiconductor device includes a plurality of second semiconductor devices,
the power converter further comprising:
at least one of a portion where two of the plurality of first semiconductor devices are continuously connected and a portion where two of the plurality of second semiconductor devices are continuously connected in the stacking direction.

14. The power converter according to claim 10, wherein:
the at least one first low potential terminal and the at least one second high potential terminal, are coupling terminals that form the upper and lower coupling that extends in a direction orthogonal to the stacking direction;
the bridging member has, as connection portions for connecting to coupling terminals, a first connection portion extending along an extension direction of the at least one first low potential terminal and surface-connected to the at least one first low potential terminal and a second connection portion extending along an extension direction of the at least one second high potential terminal and surface-connected to the at least one second high potential terminal; and
the bridging member has a connecting portion connecting the first connection portion and the second connection portion.

15. The power converter according to claim 14, further comprising:
a cooler that is between adjacent semiconductor devices of the at least one first semiconductor device and the at least one second semiconductor device in the stacking direction, wherein:

the connecting portion is connected to at least one of a lower end of the first connection portion on a cooler side and a lower end of the second connection portion on the cooler side, and faces the cooler.

16. The power converter according to claim 14, wherein:

in the bridging member, one of the first and second connection portions is connected to an inner surface of the one of the coupling terminals, the other of the first and second connection portions is connected to an outer surface of the one of the coupling terminals; and the bridging member includes: a facing portion that is connected to the connecting portion and faces an inner surface of the other of the first and second coupling terminals and a bent portion that connects the other of the first and second connection portions and the facing portion.

\* \* \* \* \*